US012507603B2

(12) United States Patent
Akinwande et al.

(10) Patent No.: US 12,507,603 B2
(45) Date of Patent: Dec. 23, 2025

(54) NON-VOLATILE RESISTANCE SWITCHING IN MONOLAYER ATOMIC SHEETS

(71) Applicant: Board of Regents, The University of Texas System, Austin, TX (US)

(72) Inventors: Deji Akinwande, Austin, TX (US); Xiaohan Wu, Boise, ID (US); Ruijing Ge, Boise, ID (US); Jack C. Lee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 447 days.

(21) Appl. No.: 17/330,078

(22) Filed: May 25, 2021

(65) Prior Publication Data

US 2021/0408372 A1    Dec. 30, 2021

Related U.S. Application Data

(60) Provisional application No. 63/044,400, filed on Jun. 26, 2020.

(51) Int. Cl.
*H10N 70/00* (2023.01)
*H10B 63/00* (2023.01)

(52) U.S. Cl.
CPC ........... *H10N 70/841* (2023.02); *H10B 63/80* (2023.02); *H10N 70/021* (2023.02); *H10N 70/821* (2023.02); *H10N 70/882* (2023.02)

(58) Field of Classification Search
CPC .................................................. H10N 70/882
See application file for complete search history.

(56) References Cited

U.S. PATENT DOCUMENTS

| | | | |
|---|---|---|---|
| 2020/0083037 A1* | 3/2020 | Park | H01L 21/02568 |
| 2020/0194435 A1* | 6/2020 | Lilak | H01L 29/42392 |
| 2020/0211642 A1* | 7/2020 | Huynh Bao | G11C 14/009 |
| 2021/0175419 A1* | 6/2021 | Sangwan | H10N 70/023 |

* cited by examiner

*Primary Examiner* — Ajay Ojha
*Assistant Examiner* — Hajar Kolahdouzan

(57) ABSTRACT

The present disclosure provides a 2-dimensional (2D) non-volatile switch (2DNS), with a vertical metal-insulator-metal (MIM) structure that includes a semiconducting monolayer crystalline non-metallic atomic sheet sandwiched between a top metal electrode and a bottom metal electrode. The 2DNS is able to perform stable non-volatile resistance switching, including both unipolar and bipolar switching, with a high ON/OFF ratio, low ON resistance, and low operating voltage. The monolayer atomic sheet may include hexagonal boron nitride (h-BN) or a transition metal dichalcogenide (TMD), such as $MoS_2$, $MoSe_2$, $WS_2$, or $WSe_2$. The present disclosure also provides methods for synthesizing a semiconducting monolayer crystalline non-metallic atomic sheet on a target substrate. The monolayer atomic sheet may include h-BN or a TMD, such as $MoS_2$, $MoSe_2$, $WS_2$, or $WSe_2$.

20 Claims, 19 Drawing Sheets
(18 of 19 Drawing Sheet(s) Filed in Color)

NON-VOLATILE RESISTANCE SWITCHING IN MONOLAYER ATOMIC SHEETS

RELATED APPLICATIONS

This application claims priority to U.S. Provisional Application No. 63/044,400 filed Jun. 26, 2020, which is incorporated herein by reference in its entirety.

TECHNICAL FIELD

This disclosure relates to non-volatile resistance switching, and more specifically, to non-volatile resistance switching in vertical metal-insulator-metal devices using monolayer atomic sheets of a transition metal dichalcogenide ("TMD") or hexagonal boron nitride ("h-BN") as the active layer.

BACKGROUND

Currently, electric devices have generally been made as small as possible in their device sizes, and certain individual devices are approaching the smallest size limits practicable. In the case of, for example, complementary metal-oxide-semiconductor ("CMOS") devices, which are broadly used memory devices, the minimum channel length that may be designed to permit their functions is around 6 nm. Thus, to create smaller and more advanced devices, it is important to find solutions to resolve the discrepancy between limited channel length and computing needs.

SUMMARY

The present disclosure provides a 2-dimensional (2D) non-volatile switch (2DNS) comprising a vertical metal-insulator-metal (MIM) structure comprising a top metal electrode, a bottom metal electrode, and a semiconducting monolayer crystalline non-metallic atomic sheet sandwiched between the top metal electrode and the bottom metal electrode. The monolayer crystalline non-metallic atomic sheet is operable to perform stable non-volatile resistance switching.

In additional embodiments, which may be combined with one another unless clearly exclusive: the monolayer crystalline non-metallic atomic sheet comprises a transition metal dichalcogenide (TMD); the TMD comprises a composition with a general formula $MX_2$, wherein M is Molybdenum or Tungsten, and wherein X is Sulphur, Selenium or Tellurium; the TMD comprises $MoS_2$; the TMD comprises $MoSe_2$; the TMD comprises $WS_2$; the TMD comprises $WSe_2$; the monolayer crystalline non-metallic atomic sheet comprises hexagonal boron nitride (h-BN); the 2DNS is further operable to perform unipolar and bipolar switching; at least one of the top metal electrode or the bottom metal electrode comprises Au; at least one of the top metal electrode or the bottom metal electrode comprises Ag; at least one of the top metal electrode or the bottom metal electrode comprises Ni; at least one of the top metal electrode or the bottom metal electrode comprises Cr; and at least one of the top metal electrode or the bottom metal electrode comprises graphene.

The present disclosure provides a method for synthesizing a semiconducting monolayer crystalline non-metallic atomic sheet on a target substrate, comprising: growing a monolayer atomic sheet transition metal dichalcogenide (TMD) layer on an initial substrate layer; growing a polydimethylsiloxane (PDMS) layer on the TMD layer; soaking the PDMS layer, TMD layer, and initial substrate layer in a solvent; separating the initial substrate layer from the TMD layer; growing a target substrate layer on the TMD layer; and removing the PDMS layer from the TMD layer, to form a semiconducting monolayer crystalline non-metallic atomic sheet comprising TMD on the target substrate layer.

In additional embodiments, which may be combined with one another unless clearly exclusive: the TMD comprises a composition with a general formula $MX_2$, wherein M is Molybdenum or Tungsten; and wherein X is Sulphur, Selenium or Tellurium; the TMD comprises $MoS_2$, $MoSe_2$, $WS_2$, or $WSe_2$; the semiconducting monolayer crystalline non-metallic atomic sheet comprising TMD on the target substrate layer is operable to perform stable non-volatile resistance switching; and the semiconducting monolayer crystalline non-metallic atomic sheet comprising TMD on the target substrate layer is operable to perform unipolar and bipolar switching.

The present disclosure further provides a method for synthesizing a semiconducting monolayer crystalline non-metallic atomic sheet on a target substrate, comprising: growing a monolayer atomic sheet hexagonal boron nitride (h-BN) layer on an initial substrate layer; spin coating a poly(methyl methacrylate) (PMMA) layer on the h-BN layer; etching away the initial substrate layer; contacting the h-BN layer with a target substrate layer; and removing the PMMA layer from the h-BN layer, to form a semiconducting monolayer crystalline non-metallic atomic sheet comprising h-BN on the target substrate layer.

In additional embodiments, which may be combined with one another unless clearly exclusive: the semiconducting monolayer crystalline non-metallic atomic sheet comprising h-BN on the target substrate layer is operable to perform stable non-volatile resistance switching; and the semiconducting monolayer crystalline non-metallic atomic sheet comprising h-BN on the target substrate layer is operable to perform unipolar and bipolar switching.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a more complete understanding of the present invention and its features and advantages, reference is now made to the following description, taken in conjunction with the accompanying drawings, which are not to scale, in which like numerals refer to like features, and in which.

Part A is a schematic representation of a TMD crossbar sandwich device.
  Part B is a schematic representation of a TMD litho-free sandwich.
  Part C is a schematic representation of a h-BN transfer-free sandwich.
  Part D is an optical image of a TMD crossbar sandwich device that is an $Au/MoS_2/Au$ crossbar device.
  Part E is an optical image of a TMD litho-free sandwich device on $Si/SiO_2$ substrate, with a dashed box that indicates the area covered with $MoS_2$.

Part F is a transmission electron microscopy ("TEM") cross-section image of a TMD litho-free sandwich device that is an Au/MoS$_2$/Au litho-free device.

Part G is a graph of a Raman spectrum showing Raman shift (cm$^{-1}$) versus Raman intensity (a.u.) of MOCVD-grown monolayer MoS$_2$, MoSe$_2$, WS$_2$ and WSe$_2$, used in MIM device analysis.

Part H is a graph of a PL spectrum showing energy (eV) versus PL intensity (a.u.) MOCVD-grown monolayer MoS$_2$, MoSe$_2$, WS$_2$ and WSe$_2$, used in MIM device analysis.

Part I is a graph of a Raman spectrum showing Raman shift (cm$^{-1}$) versus Raman intensity (a.u.) of CVD-grown h-BN.

Figure 2:

FIG. 2 is a schematic diagram of Polydimethylsiloxane ("PDMS") assisted pick-and-place transfer fabrication, using TMD.

Figure 3:
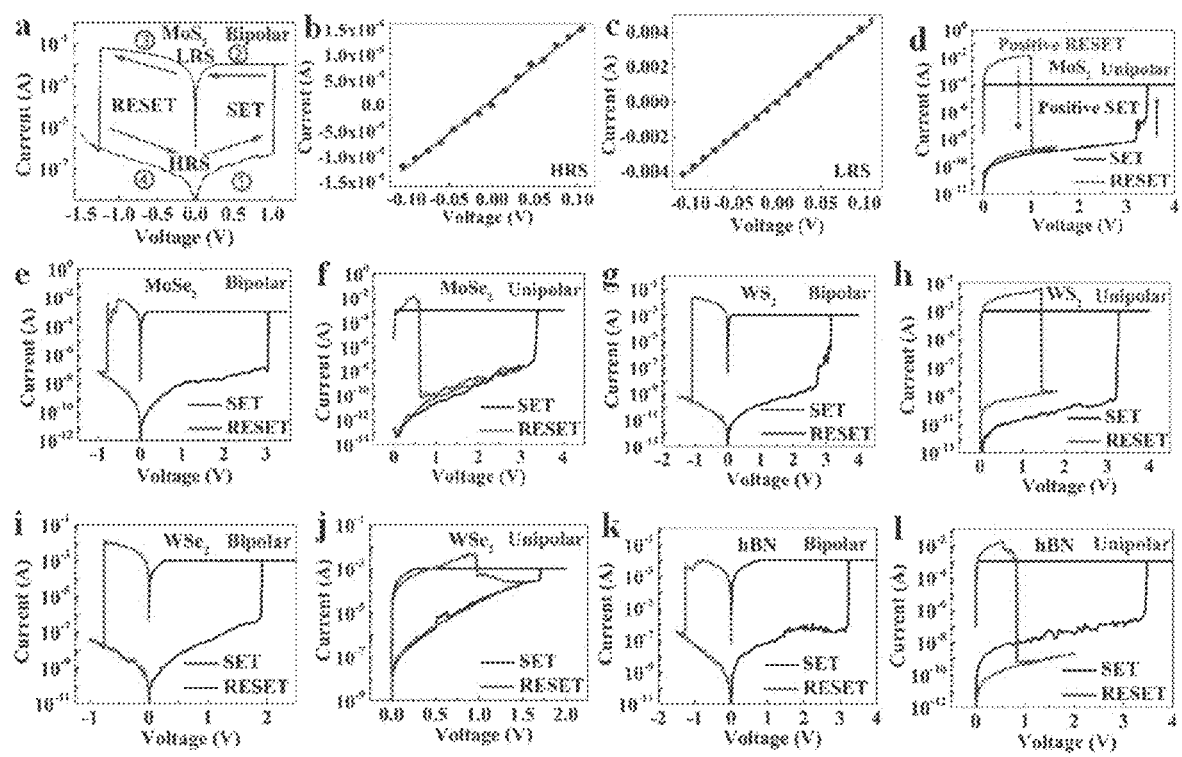

FIG. 3, Parts A-L, is representative graphs of voltage (V) versus current (A) of monolayer TMD and h-BN 2DNS devices.

Part A is a graph of voltage (V) versus current (A), showing bipolar resistive switching in a monolayer MoS$_2$ crossbar device, with an area of 2×2 μm$^2$.

Part B is a graph of voltage (V) versus current (A) of a MoS$_2$ crossbar device, with an area of 2×2 μm$^2$, at a high resistance state.

Part C is a graph of voltage (V) versus current (A) of a MoS$_2$ crossbar device, with an area of 2×2 μm$^2$, at a low resistance state.

Part D is a graph of voltage (V) versus current (A), showing unipolar resistive switching in a MoS$_2$ crossbar device, with an area of 2×2 μm$^2$.

Part E is a graph of voltage (V) versus current (A), showing bipolar resistive switching in a monolayer MoSe$_2$ crossbar device, with an area of 0.4×0.4 μm$^2$.

Part F is a graph of voltage (V) versus current (A), showing unipolar resistive switching in a monolayer MoSe$_2$ crossbar device, with an area of 0.4×0.4 μm$^2$.

Part G is a graph of voltage (V) versus current (A), showing bipolar resistive switching in a monolayer WS$_2$ crossbar device, with an area of 2×2 μm$^2$.

Part H is a graph of voltage (V) versus current (A), showing unipolar resistive switching in a monolayer WS$_2$ crossbar device, with an area of 2×2 μm$^2$.

Part I is a graph of voltage (V) versus current (A), showing bipolar resistive switching in a monolayer WSe$_2$ crossbar device, with an area of 2×2 μm$^2$.

Part J is a graph of voltage (V) versus current (A), showing unipolar resistive switching in a monolayer WSe$_2$ crossbar device, with an area of 2×2 μm$^2$.

Part K is a graph of voltage (V) versus current (A), showing bipolar resistive switching in a monolayer h-BN crossbar device, with an area of 1×1 μm$^2$.

Part L is a graph of voltage (V) versus current (A), showing unipolar resistive switching in a monolayer h-BN crossbar device, with an area of 1×1 μm$^2$.

Figure 4:
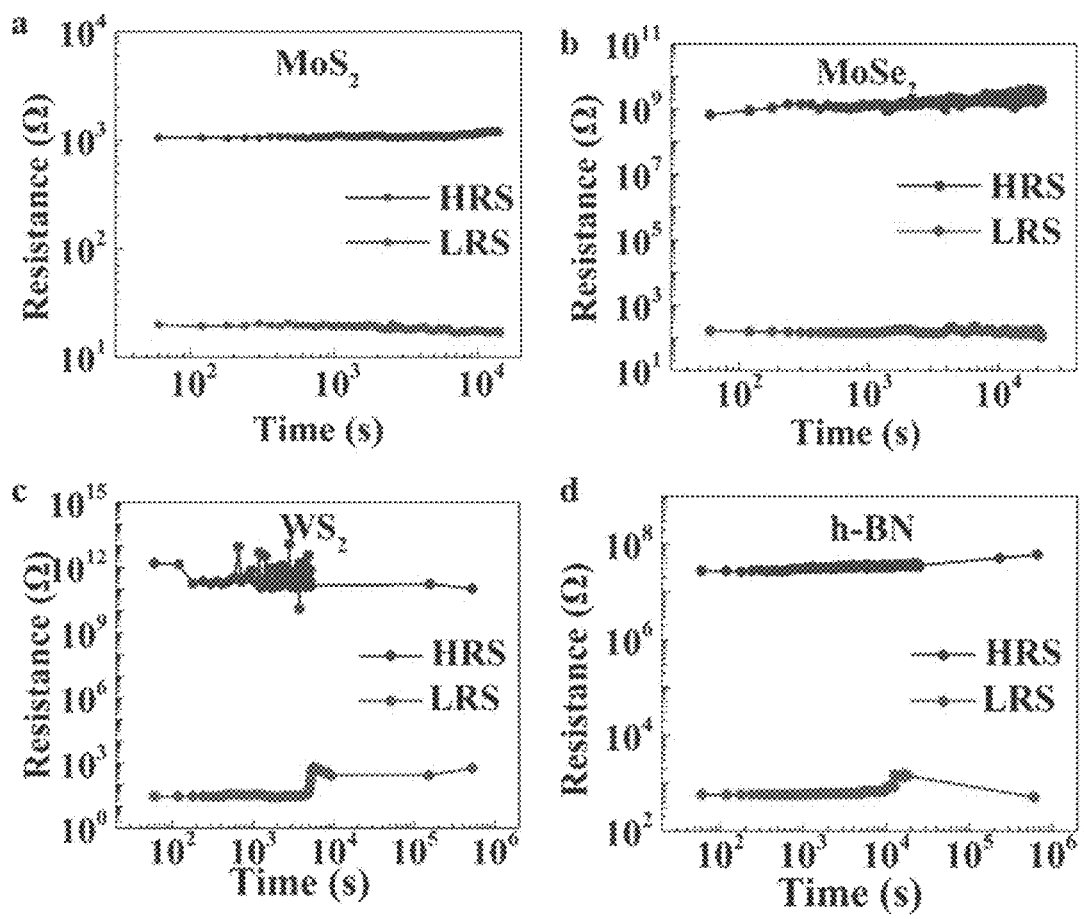

FIG. 4, Parts A-D, is graphs of retention time of monolayer TMD's and h-BN crossbar (non-volatile switch) devices, with resistance determined by the current read at 0.1 V.

Part A is a graph of retention time (s) versus resistance (Ω) of a monolayer MoS$_2$ crossbar device with an area of 10×10 μm$^2$, at room temperature.

Part B is a graph of retention time (s) versus resistance (Ω) of a monolayer MoSe$_2$ crossbar device with an area of 0.4×0.4 μm$^2$, at room temperature.

Part C is a graph of retention time (s) versus resistance (Ω) of a monolayer WS$_2$ crossbar device with an area of 2×2 μm$^2$, at room temperature.

Part D is a graph of retention time (s) versus resistance (Ω) of a monolayer h-BN crossbar device with an area of 2×2 μm$^2$, at room temperature.

Figure 5:
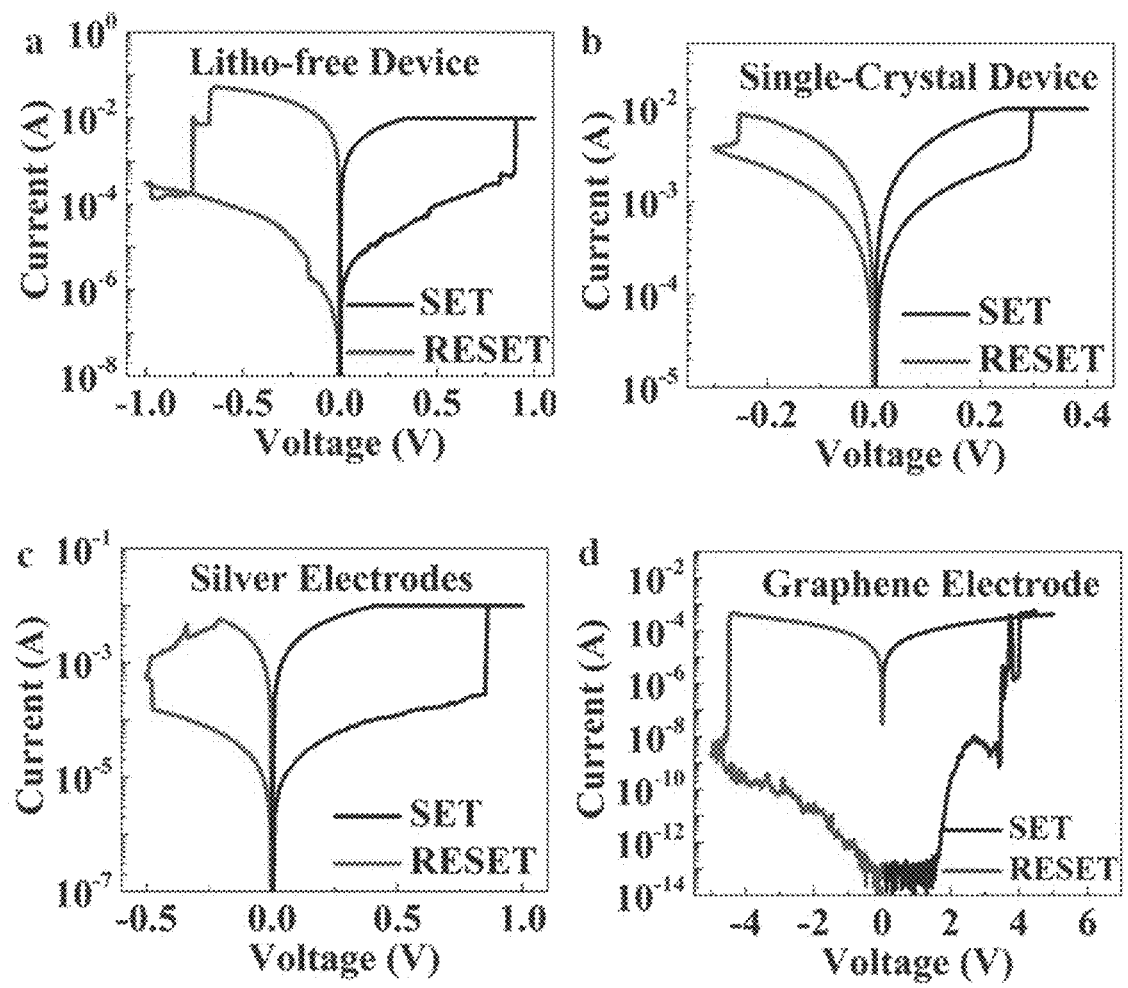

FIG. 5, Parts A-D, is graphs of voltage (V) versus current (A) of a monolayer MoS$_2$ non-volatile sandwich device under different device conditions.

Part A is a graph of voltage (V) versus current (A) of a monolayer litho-free Au/MoS$_2$/Au device with a lateral area of 20×20 μm$^2$.

Part B is a graph of voltage (V) versus current (A) of a single-crystal MoS$_2$ device with Au top and bottom electrodes.

Part C is a graph of voltage (V) versus current (A) of a MoS$_2$ litho-free device with Ag top and bottom electrodes.

Part D is a graph of voltage (V) versus current (A) of a MoS$_2$ crossbar device with graphene as the top electrode and Au as the bottom electrode, the device having a graphene/MoS$_2$/Au structure and an area of 1×1 μm$^2$.

Figure 6:
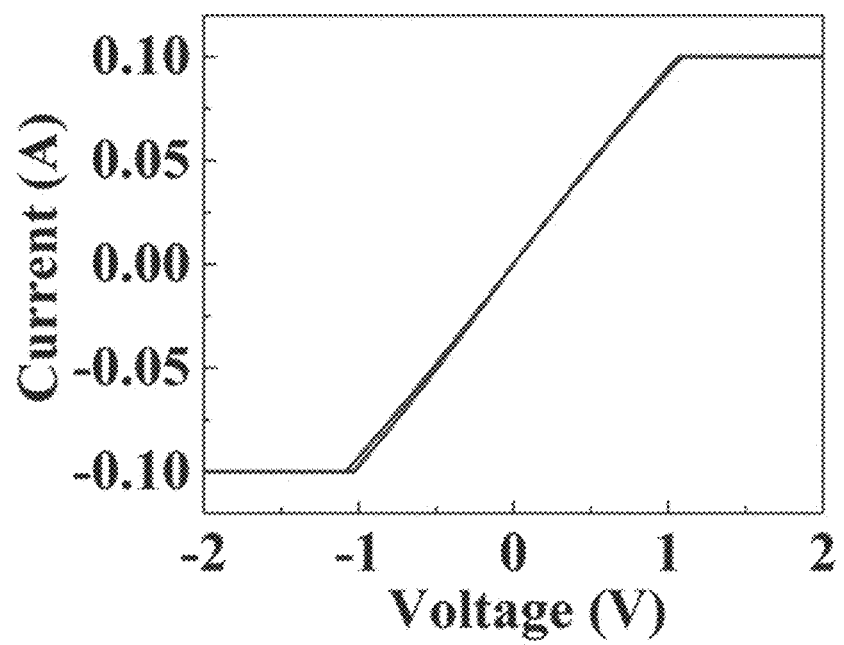

FIG. 6 is a graph of voltage (V) versus current (A) for a test crossbar (non-volatile switch) device that does not contain an 2D active layer.

Figure 7:
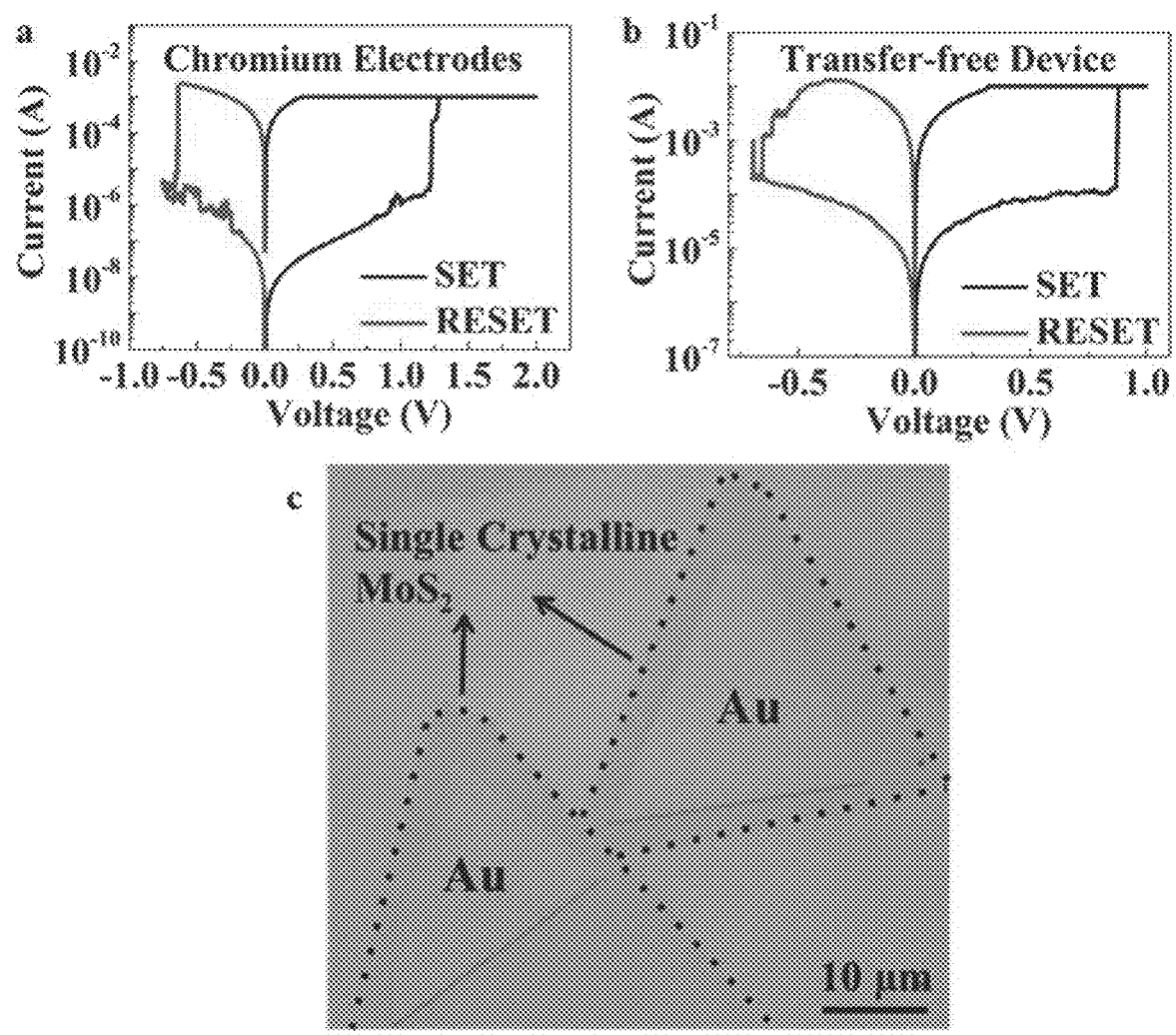

FIG. 7, Parts A-C, is representative graphs of voltage (V) versus current (A) for a test crossbar (non-volatile switch) device and an optical image of different device structures.

Part A is a representative graph of voltage (V) versus current (A) for a litho-free 4-layer MoS$_2$ device, using Cr as both top and bottom electrodes, the device having a Cr/MoS$_2$/Cr structure and an area of 15×15 μm$^2$.

Part B is a representative graph of voltage (V) versus current (A) for a litho-free h-BN MIM devices, using Ni foil as the bottom electrode and Au as the top electrode, the litho-free h-BN device having an area of 10×10 μm$^2$.

Part C is an optical microscope image of a single crystalline monolayer MoS$_2$ MIM device, with Au top and bottom electrodes.

Figure 8:
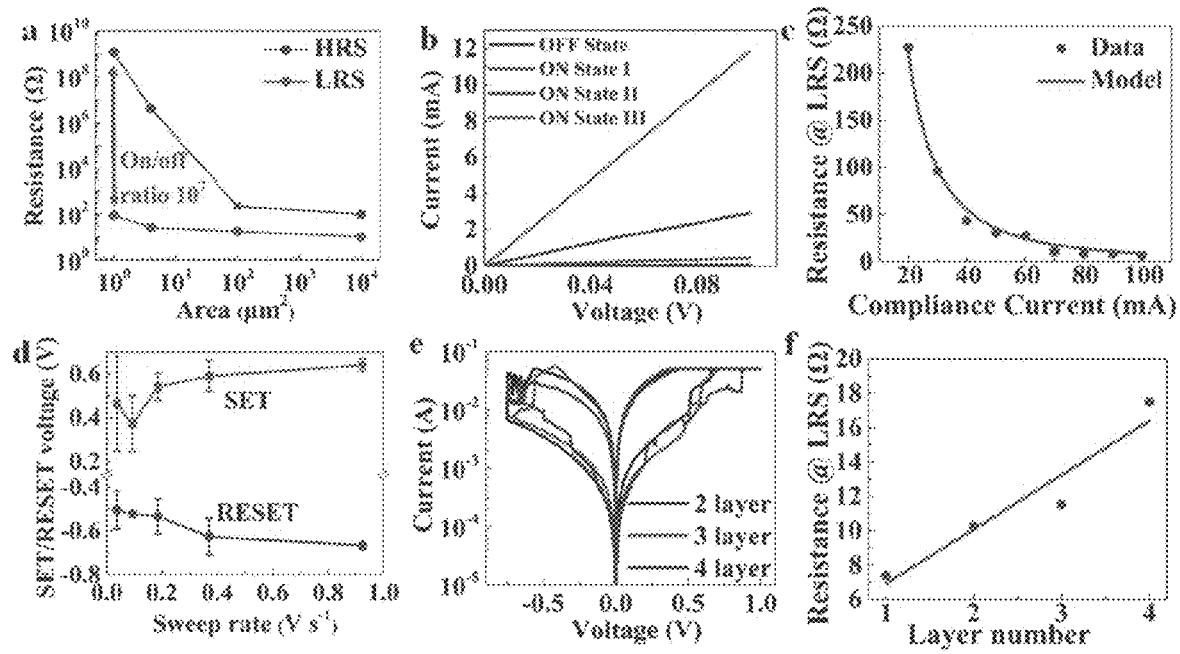

FIG. 8 is graphs of area scaling, compliance current, sweep rate, layer thickness of a monolayer MoS$_2$ non-volatile switching device.

Part A is a graph of area (μm$^2$) versus resistance (Ω) of a monolayer MoS$_2$ device with Au/MoS$_2$/Au structure, with resistance of low and high resistance states determined at a low voltage of 0.1 V.

Part B is a graph of voltage (V) versus current (A) of a MoS$_2$ litho-free 2D non-volatile switch device.

Part C is a graph of compliance current (mA) versus resistance at a low resistance state (Ω) of a MoS$_2$ litho-free 2DNS device, with a fitting curve obtained using an inverse quadratic model, $y \propto x^{-2}$.

Part D is a graph of sweep rate (V s$^{-1}$) versus SET/RESET voltage (V) of a MoS$_2$ litho-free 2DNS device, with an area of 15×15 μm$^2$.

Part E is a graph of voltage (V) versus current (A), showing layer dependent I-V characteristics of 2, 3, and 4-layer MoS$_2$ litho-free MIM devices, each with an area of 15×15 μm$^2$.

Part F is a graph of layer number versus resistance at a low resistance state (Ω), with the straight line on the graph added as a visual guide.

Figure 9:
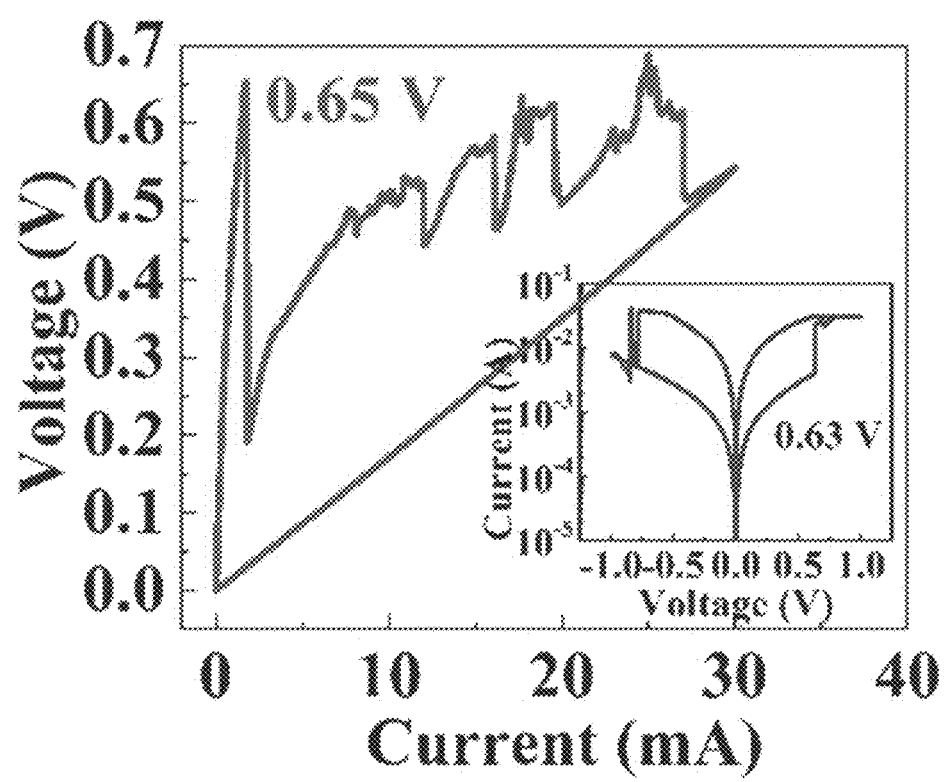

FIG. 9 is a graph of current (mA) versus voltage (V), showing the current sweep SET operation of a monolayer MoS₂ crossbar device with an area of 10×10 μm², with an inset graph of voltage (V) versus current (mA) for the same device.

Figure 10:
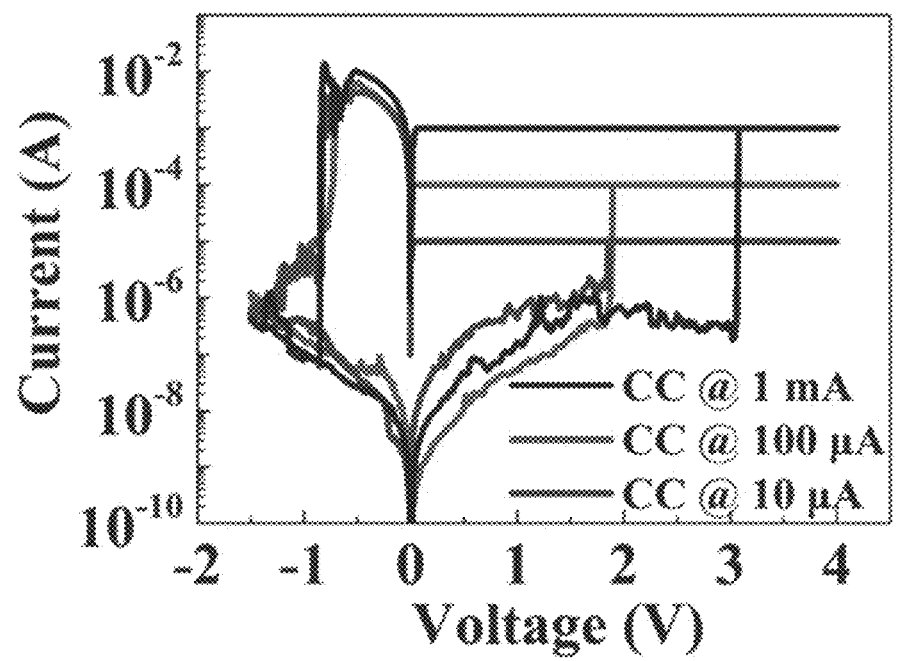

FIG. 10 is a graph of voltage (V) versus current (A) for low compliance current operation of a h-BN crossbar device, with an area of 2×2 μm².

Figure 11:
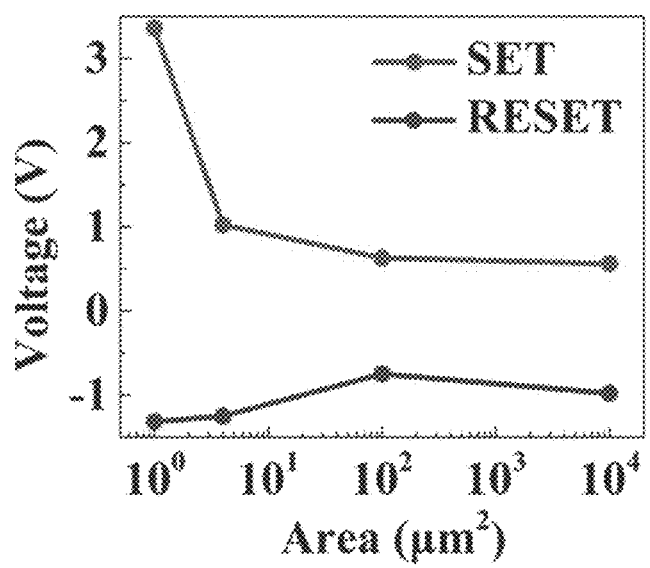

FIG. 11 is a graph of SET and RESET voltages (V) versus area (μm²) for MoS₂ crossbar devices.

Figure 12:
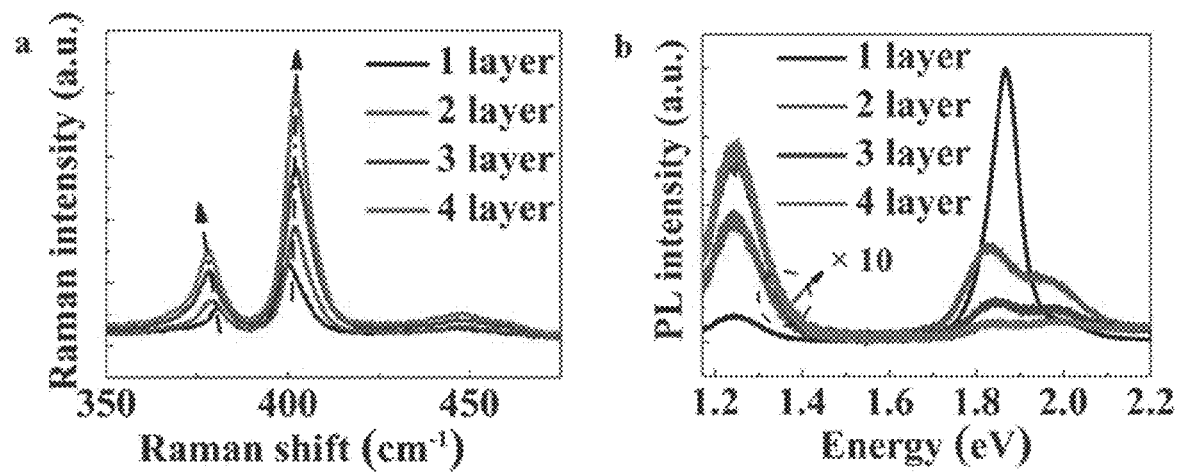

FIG. 12, Parts A-B, is a Raman and PL spectrum of one to four-layer MoS₂ thin films.

Part A is a graph of a Raman spectrum showing Raman shift (cm⁻¹) versus Raman intensity (a.u.) of one to four-layer MoS₂ thin films.

Part B is a PL spectra showing energy (eV) versus PL intensity (a.u.) of one to four-layer MoS₂ thin films, and with the intensity of two to four-layer MoS₂ spectra magnified by 10× for visibility.

Figure 13:
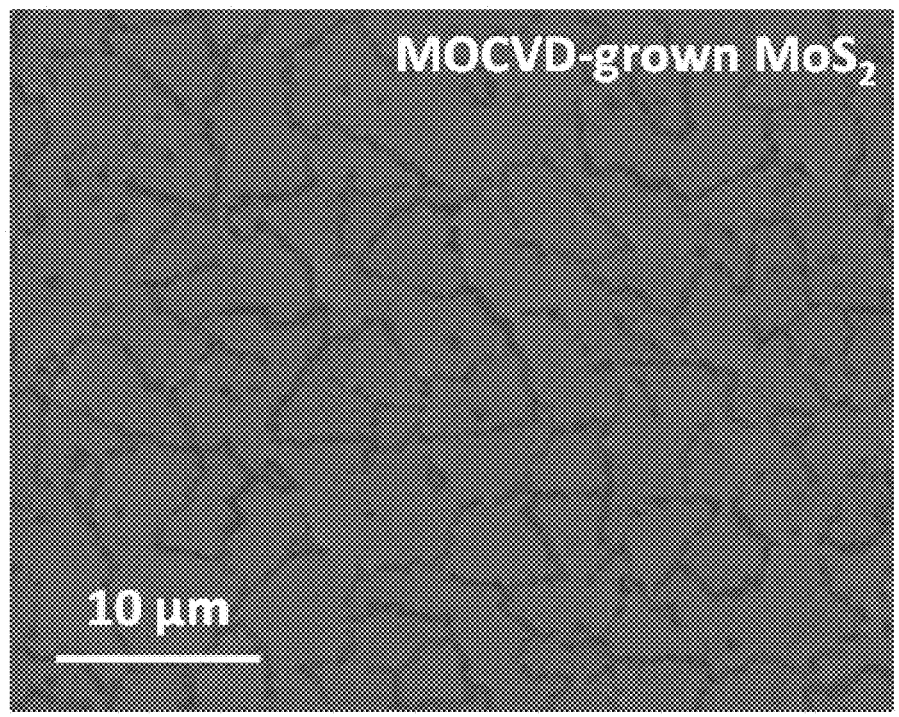

FIG. 13 is a scanning electron microscope ("SEM") image of MOCVD monolayer MoS₂.

Figure 14:
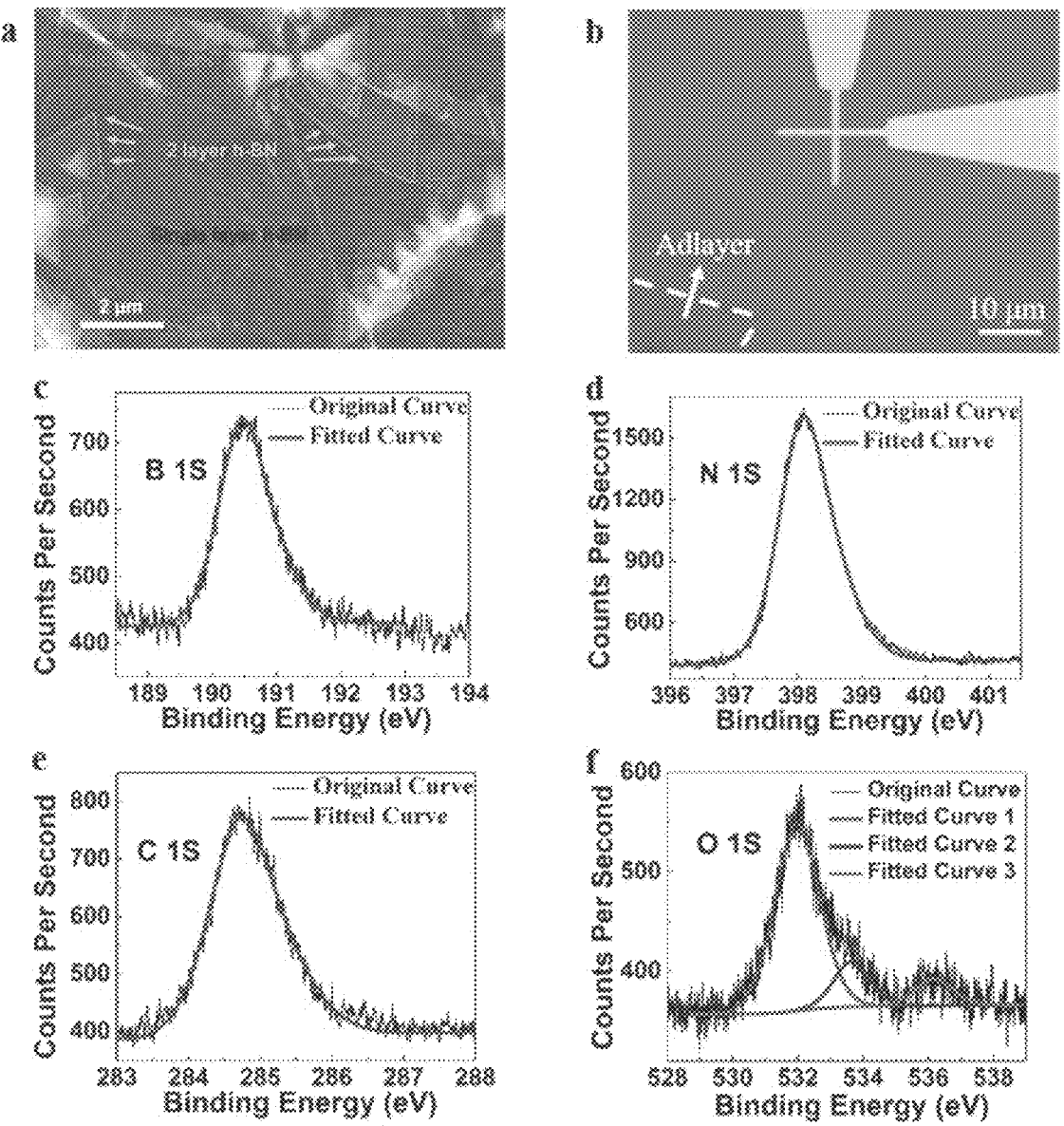

FIG. 14 is an SEM image and XPS characterization of as-grown CVD h-BN.

Part A is an SEM image of as-grown CVD h-BN.

Part B is an optical microscope image of an h-BN crossbar device, with a dashed line indicating the presence of adlayer, and the rest of the image filled with monolayer h-BN.

Part C is a graph of binding energy (eV) versus counts per second, showing results obtained from X-ray photoelectron spectroscopy ("XPS") of as-grown h-BN.

Part D is a graph of binding energy (eV) versus counts per second, showing results obtained from XPS of as-grown h-BN.

Part E is a graph of binding energy (eV) versus counts per second, showing results obtained from XPS of as-grown h-BN.

Part F is a graph of binding energy (eV) versus counts per second, showing results obtained from XPS of as-grown h-BN, and including fitted curves 1-3.

Figure 15:
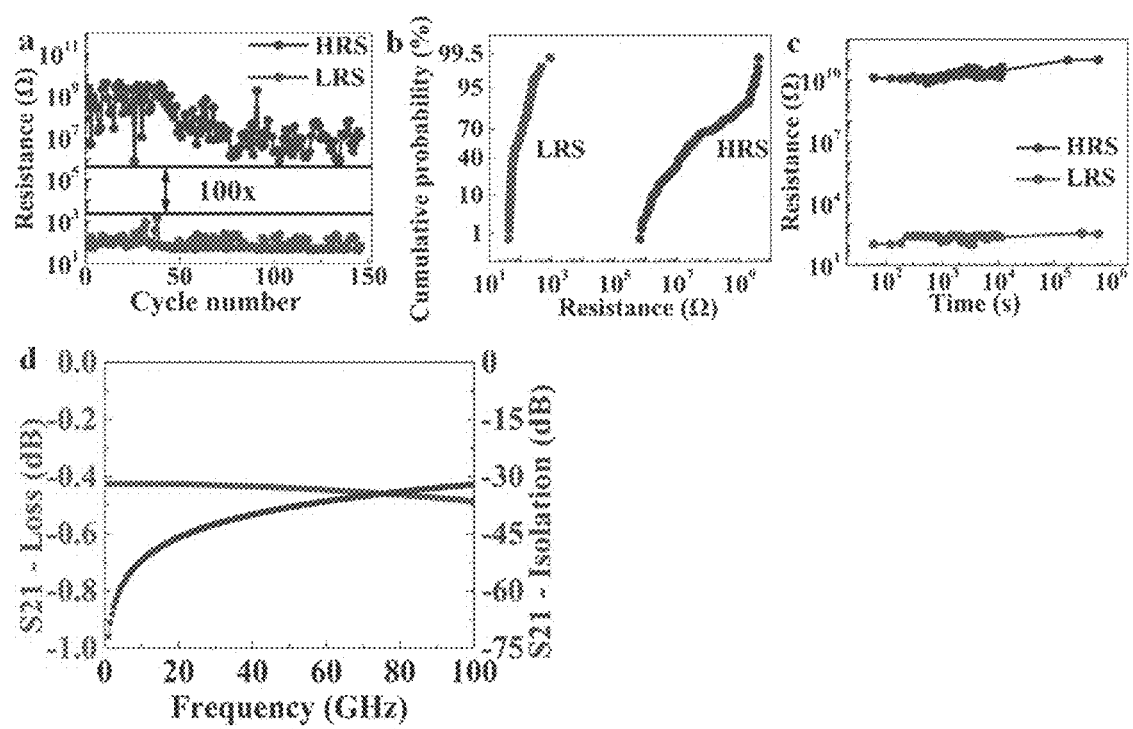

FIG. 15, Parts A-D, is graphs of performance characteristics of a MoS₂ crossbar MIM device.

Part A is a graph of cycle number versus resistance (Ω), showing endurance distribution of a MoS₂ crossbar MIM device, with 150 manual DC switching cycles.

Part B is a graph of cycle number versus resistance (Ω), showing resistance distribution of a MoS₂ crossbar MIM device, with 150 manual DC switching cycles.

Part C is a graph of time (s) versus resistance (Ω) of a MoS₂ crossbar device, with an area of 2×2 μm², and with the resistance of the HRS and LRS determined by current read at 0.1 V, at room temperature.

Part D is a graph of frequency (GHz) versus S21—Loss (dB) and S21—Isolation (dB), showing RF simulation results in a 50Ω system for a 2DNS switch with a DC $R_{on}$ of 5Ω and a parallel-plate $C_{off}$ of 40 fF/μm², the system representative of a MIM device with area 0.1×0.1 μm².

Figure 16:
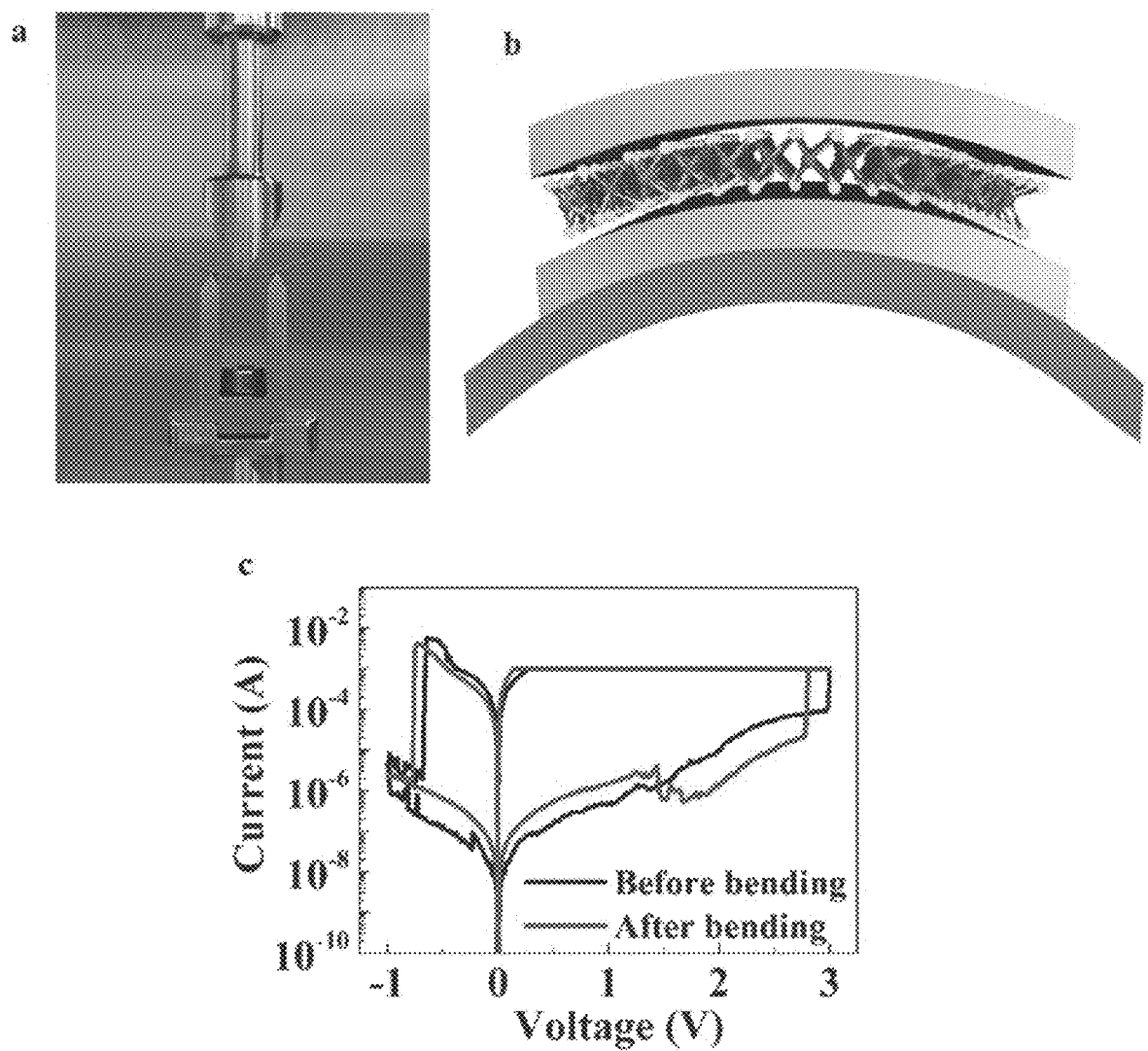

FIG. 16, Parts A-C, is a dynamic mechanical analysis ("DMA") and graph of voltage (V) versus current (A) of a bilayer MoS₂ crossbar devices on PI substrate, before and after bending via DMA apparatus.

Part A is a photographic image of a bent bilayer MoS₂ crossbar device on polyimide ("PI") substrate via DMA apparatus.

Part B is a schematic diagram of the bent MoS₂ device, produced by the DMA apparatus shown in Part A, sandwiched by gold electrodes on flexible substrate.

Part C is a graph of voltage (V) versus current (A) of a bilayer MoS₂ crossbar device on PI substrate, before and after bending via DMA apparatus, showing switching I-V curves of bilayer MoS₂ crossbar devices before and after 1000 cycles at 1% strain.

Figure 17:
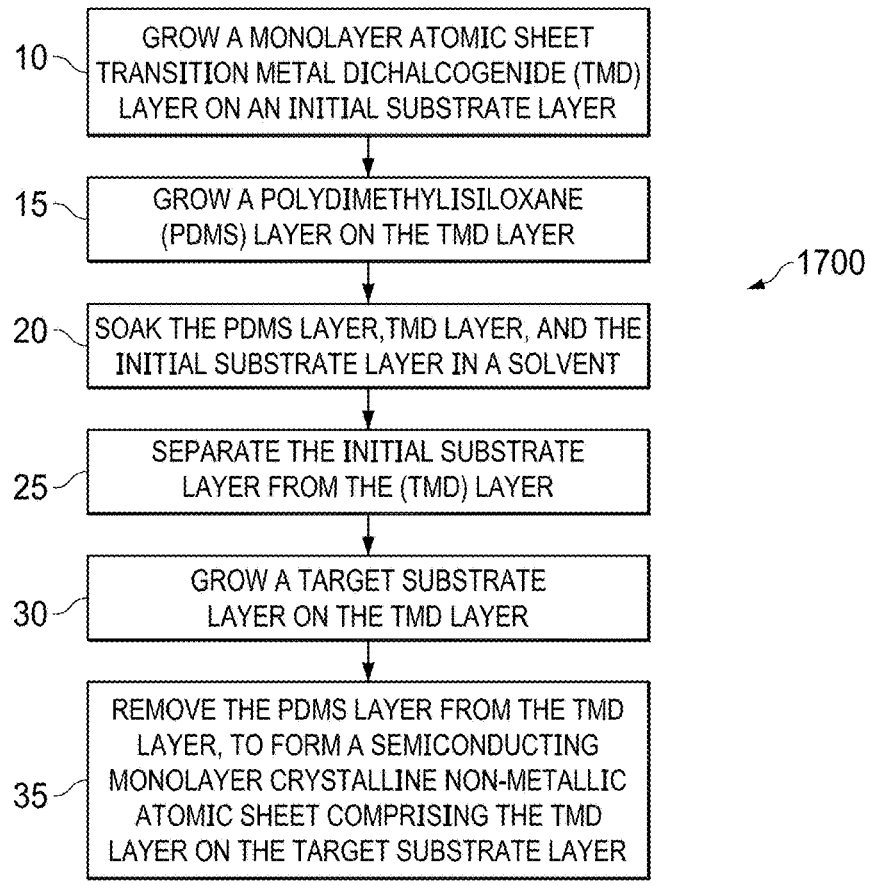

FIG. 17 is a flowchart of a method for synthesizing a semiconducting monolayer crystalline non-metallic atomic sheet on a target substrate, where the monolayer atomic sheet includes a TMD.

Figure 18:
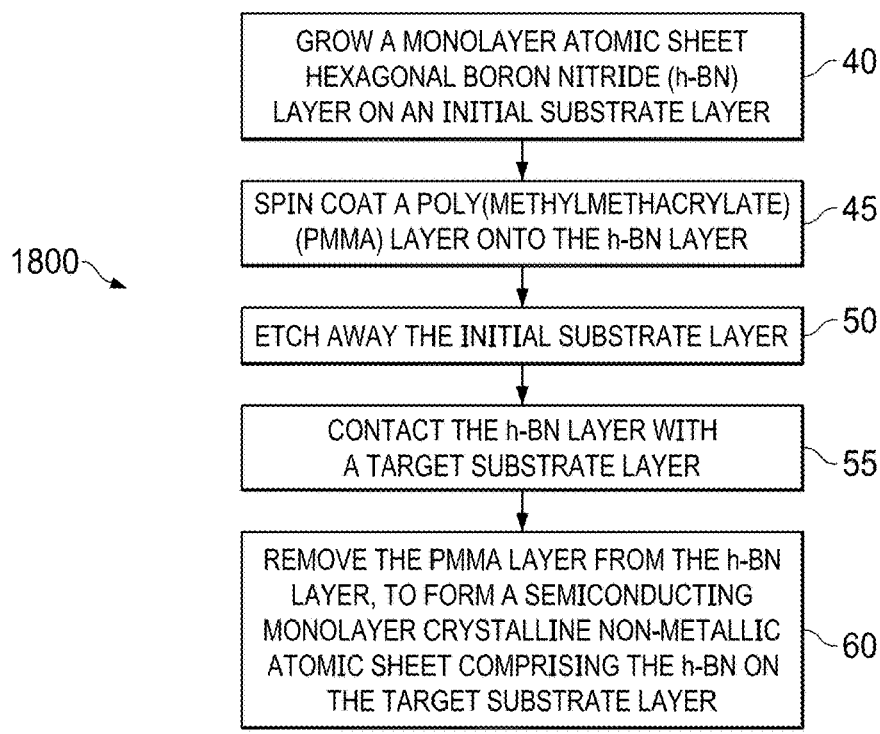

FIG. 18 is a flowchart of a method for synthesizing a semiconducting monolayer crystalline non-metallic atomic sheet on a target substrate, where the monolayer atomic sheet includes h-BN.

Figure 19:
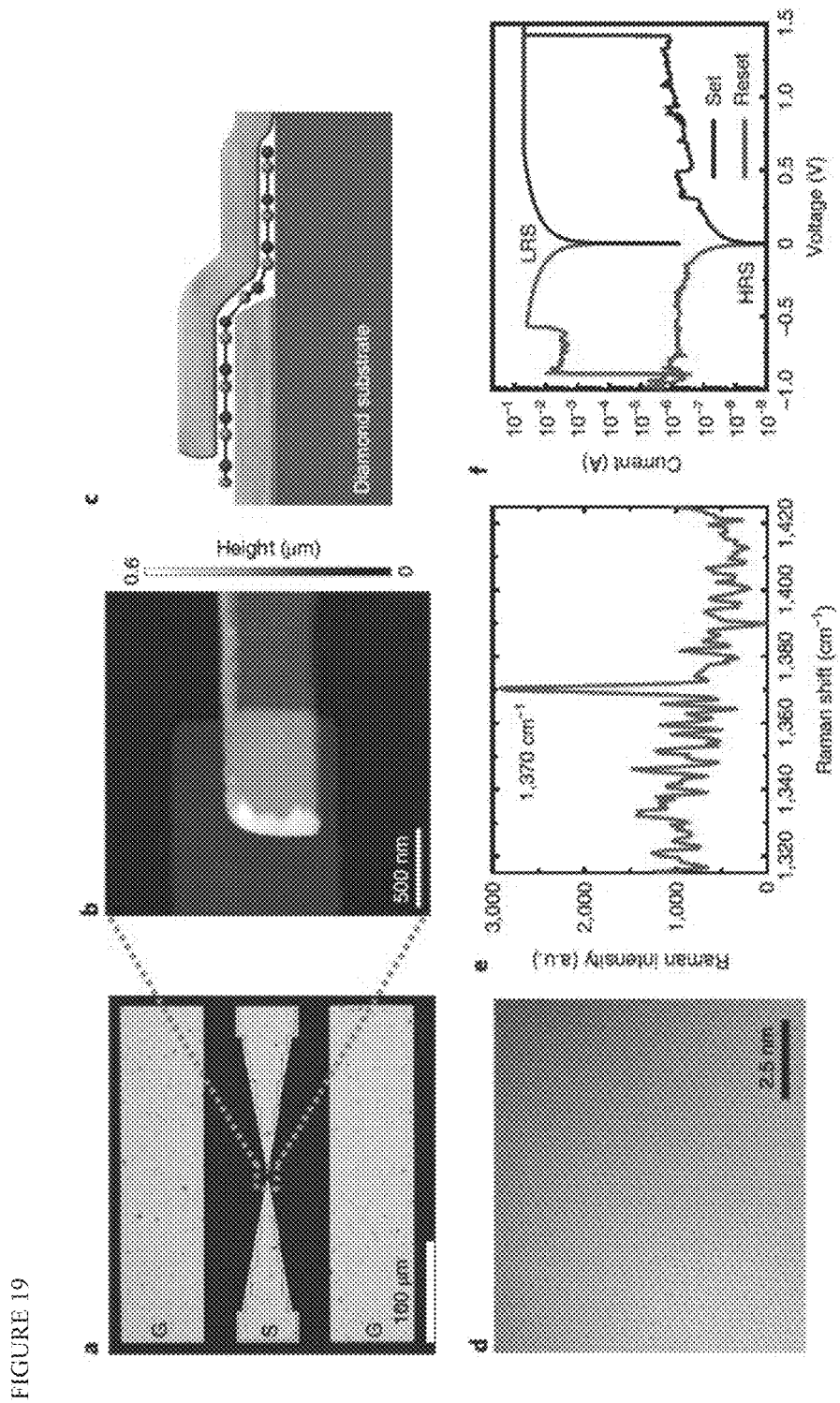

FIG. 19 is a set of figures relating to device structure and material characterization.

Part A is an optical microscopy image of a fabricated monolayer hBN RF switch with GSG Au electrodes. The dashed box in a marks the area in which the vertical MIM structure is located.

Part B is a representative atomic force microscopy image of the dashed box region in a with an overlap area of 0.5×0.5 μm².

Part C is a simplified side-view illustration of the RF switch device on a diamond substrate.

Part D is an atomic-resolution transmission electron microscopy image of CVD-grown hBN.

Part E is raman spectroscopy of CVD-grown monolayer hBN.

Part F is a typical current-voltage curve of the resistive switching behavior of a monolayer hBN device with an overlap area of 0.5×0.5 μm². HRS, high-resistance state; LRS, low-resistance state.

Figure 20:
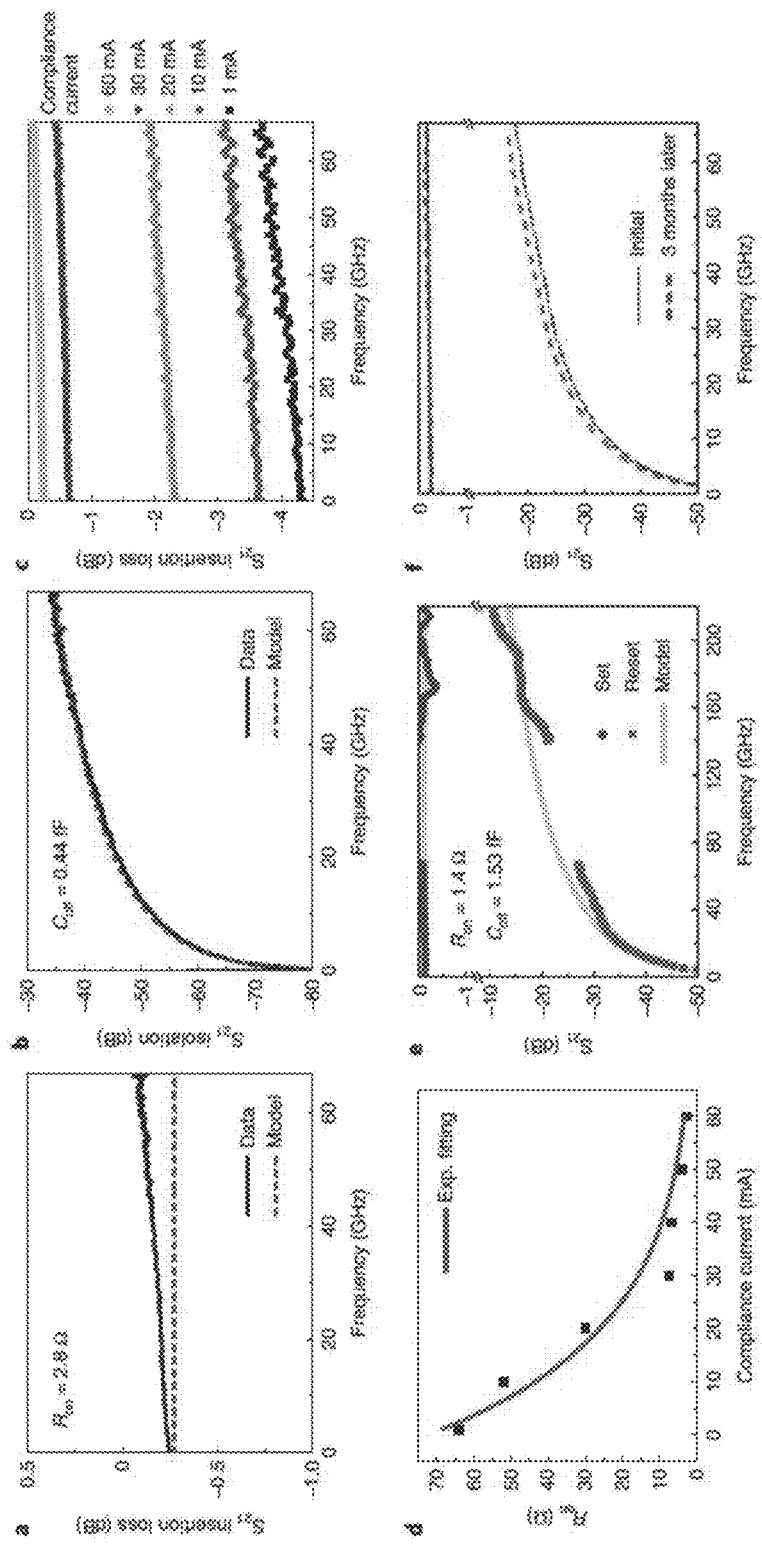

FIG. 20 is a set of figures relating to high-frequency performance of an hBN non-volatile switch.

Part A is a graph of de-embedded experimental S-parameter S21 data in the on (insertion loss) state of the RF switch.

Part B is a graph of de-embedded experimental S-parameter S21 data in the off (isolation) state of the RF switch.

Part C is a graph of frequency and insertion loss of the device.

Part D is a graph of compliance current and $R_{on}$ for the device.

Part E is a graph of measured higher-frequency S-parameter (S21) data and model line into the terahertz range. The set and reset data are measured on 0.5×0.5 μm² and 0.25×0.25 μm² overlap area devices.

Part F is a graph of frequency and S-parameter (S21) data. The device size is 0.5×0.5 μm².

Figure 21:
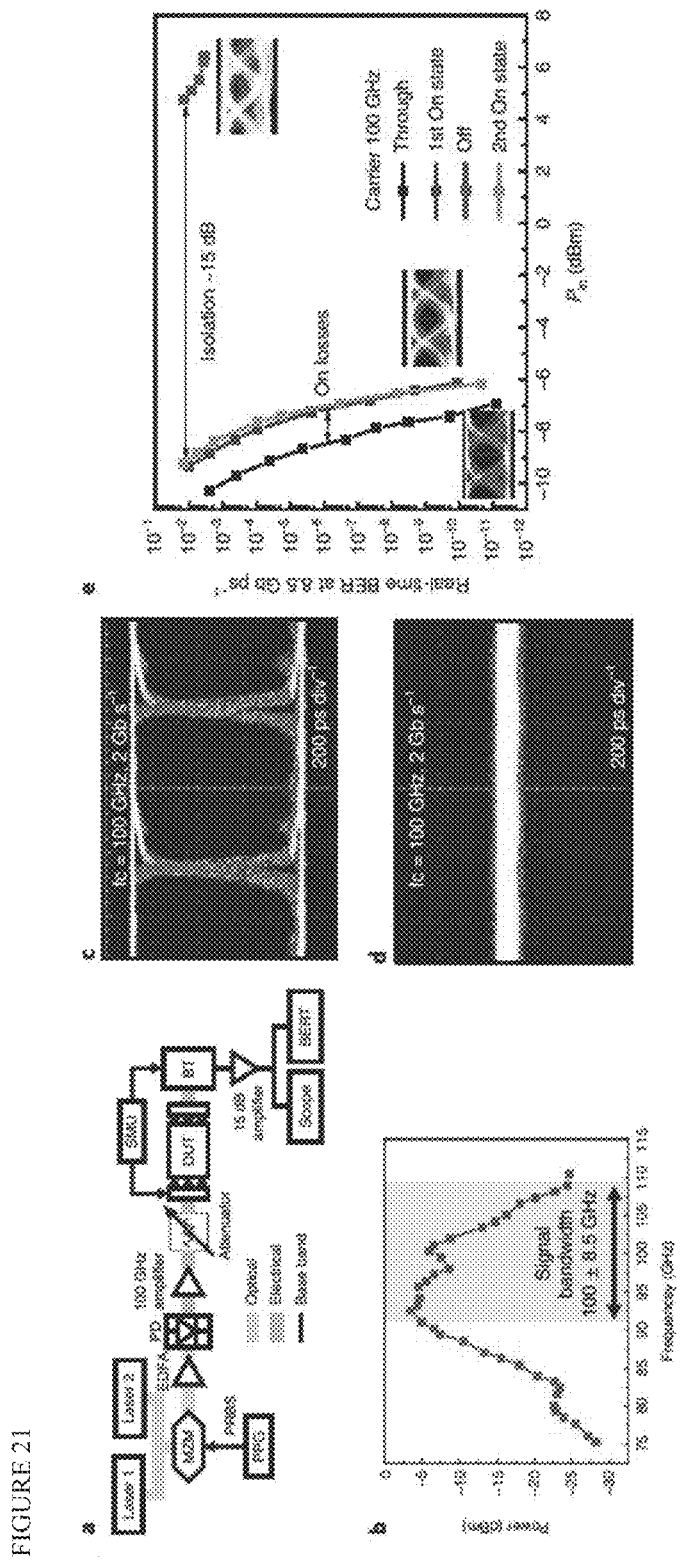

FIG. 21 is a set of figures related to data communication performance.

Part A is a diagram of the measurement set-up for eye diagrams and BERs. BERT, tester; div, division; DUT, device under test; EDFA, erbium-doped fibre amplifier; MZM, Mach-Zehnder modulator; PRBS, pseudo-random bit sequence; SMU, source measurement unit; BT, bias-tee; PD, photodiode; PPG, pulse pattern generator.

Part B is a graph of the frequency response of the measurement system of Part A.

Part C is a switch on state opened eye diagram at fc=100 GHz and a bit rate of 2 Gbit s⁻¹.

Part D is a switch off state closed eye diagram at fc=100 GHz and a bit rate of 2 Gbit s⁻¹.

Part E is BER measurements with different switch status. Insets: eye diagrams measured at fc=100 GHz with a bit rate of 8.5 Gbit s$^{-1}$ show similar on-state BER after a switching cycle.

Figure 22:
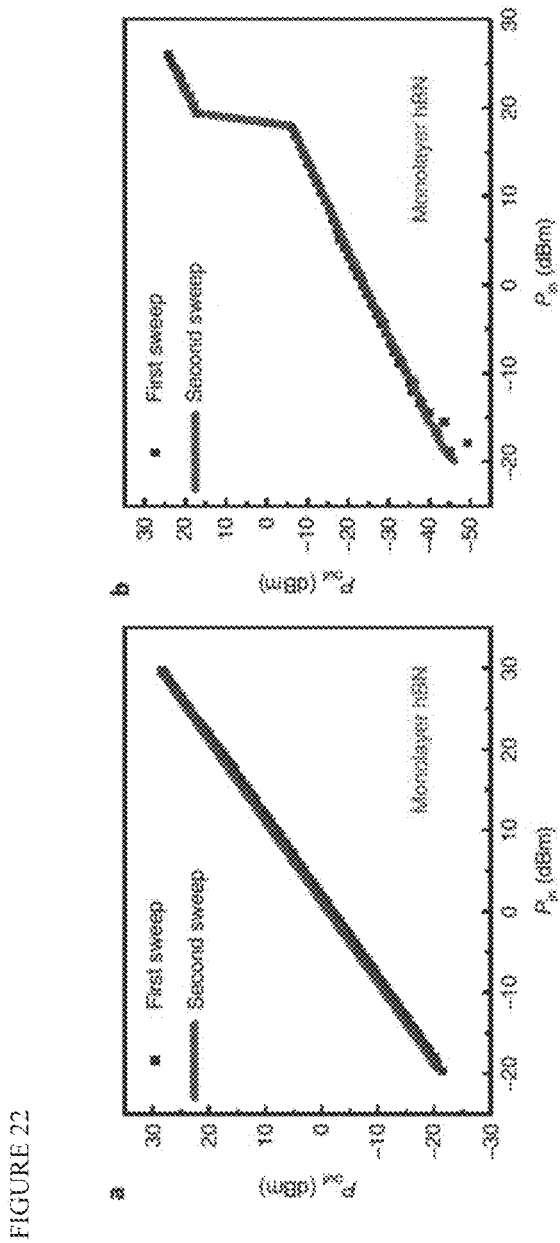

FIG. 22 is a set of figures relating to signal power handling of monolayer hBN RF switches.

Part A is a representative power handling measurement in the on state at 40 GHz for a monolayer hBN RF switch.

Part B is a representative power handling measurement in the off state at 40 GHz for a monolayer hBN RF switch. The off state experiences self-switching at ~20 dBm.

Figure 23:
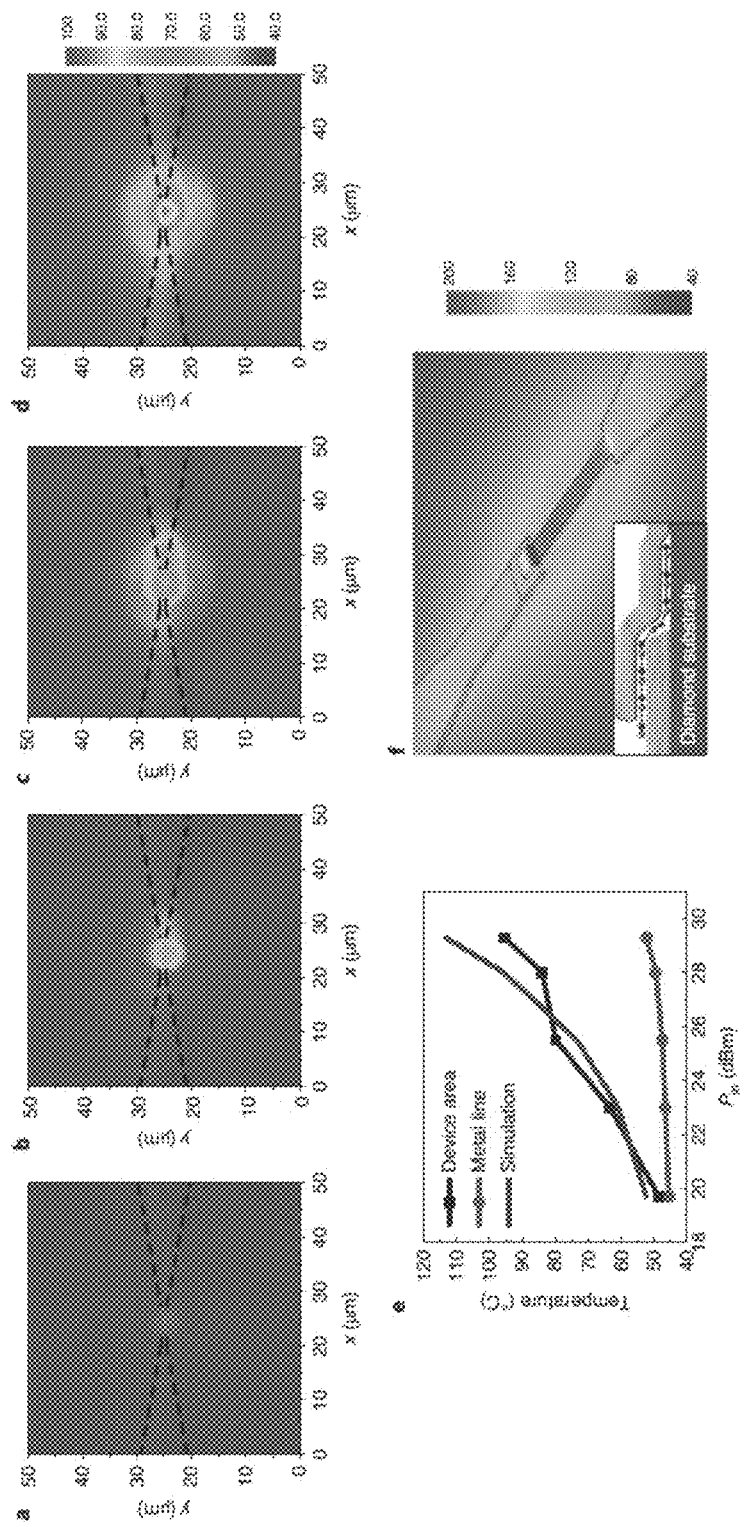

FIG. 23 is a set of figures relating to thermal mapping and simulation.

Part A is a thermal mapping image (° C., colour scale) of hBN RF switch with a RF $P_{in}$ value of 19.7 dBm. The dashed lines represent the edges of the Au signal lines that feed the RF power to the metal-hBN-metal junction.

Part B is a thermal mapping images (° C., colour scale) of hBN RF switch with a RF $P_{in}$ value of 23 dBm. The dashed lines represent the edges of the Au signal lines that feed the RF power to the metal-hBN-metal junction.

Part C is a thermal mapping images (° C., colour scale) of hBN RF switch with a RF $P_{in}$ value of 25.5 dBm. The dashed lines represent the edges of the Au signal lines that feed the RF power to the metal-hBN-metal junction.

Part D is a thermal mapping images (° C., colour scale) of hBN RF switch with a RF $P_{in}$ value of 29.3 dBm. The dashed lines represent the edges of the Au signal lines that feed the RF power to the metal-hBN-metal junction.

Part E is a graph of experimentally measured temperature dependency versus $P_{in}$ at the device junction region and metal line. A COMSOL simulation in the junction area is included for electrothermal modelling purposes. The experimental data were collected by a 2×2 µm$^2$ resolution infrared camera.

Part F is a COMSOL simulation using an a.c. and heat-transfer module shows a high temperature around the vertical MIM structure with a mesa configuration at a $P_{in}$ of 29.3 dBm. Inset: mesa structure of the current experimental device.

DETAILED DESCRIPTION

The present disclosure provides stable non-volatile resistance switching ("NVRS") in semiconducting single-layer (referred to throughout this disclosure as monolayer) crystalline atomic sheets sandwiched between a top metal electrode ("TE") and a bottom metal electrode ("BE"). Due to the sandwiched structure, these devices may be called vertical metal-insulator-metal ("MIM") devices. The present disclosure provides stable NVRS in non-metallic 2-dimensional ("2D") monolayers including, for example, transitional metal dichalcogenides ("TMD"s) as well as hexagonal boron nitride ("h-BN"). The disclosed devices are collectively referred to as 2D non-volatile switches ("2DNS"). An example of TMD may be described by the general formula $MX_2$, where M may be Molybdenum or Tungsten, and X may be Sulphur, Selenium, or Tellurium. Specific examples of monolayer TMD's include $MoS_2$, $MoSe_2$, $WS_2$, and $WSe_2$.

These monolayer 2D materials, which generally refer to crystalline materials that only include one or few layers of atoms, are thought to assist in overcoming the physical limitations of today's electric devices. Specifically, the disclosed 2D materials systems display NVRS, in which resistance may be modulated between a high-resistance state ("HRS") and a low-resistance state ("LRS") and subsequently retained absent any power supply.

To describe this effect, resistive switching refers to the physical phenomena where a dielectric suddenly changes its (two terminal) resistance under the action of a strong electric field or current. The change of resistance may be non-volatile and reversible. Typical resistive switching systems are capacitor-like devices, which often consist of a non-metallic resistive switching layer sandwiched between two ordinary metal electrodes. When the resistive switching layer does not allow electricity to be conducted from the high electric potential electrode to the low potential electrode, this may be called HRS. In contrast, when the resistive switching layer allows electricity to be conducted from one electrode to the other, this may be called LRS.

These 2DNS devices can operate in both unipolar and bipolar switching (voltage sweep in the same or opposite direction), with a high ON/OFF ratio (the difference between the ON state current and OFF state current), low ON resistance, and low operating voltage (reducing power consumption), which provides repeatable non-volatile switching in a simple scalable vertical device structure. By operating in both unipolar and bipolar switching, with a high ON/OFF ratio, these devices enable multi-bit storage in single device and RF switch applications. Further, these devices do not require a forming process and may operate at room temperature under ambient conditions. By using monolayer TMD or h-BN as the active layer in the vertical MIM structure, the scale of the device may be greatly reduced, increasing integration density.

In these next-generation 2DNS devices, the vertical MIM structure may be grown at least by chemical vapor deposition ("CVD") or metal-organic CVD ("MOCVD") techniques, in which a monolayer TMD or h-BN is grown on a substrate. Use of CVD or MOCVD techniques may result in a large-scale monolayer TMD or h-BN continuous film, which facilitates practical implementation into complementary metal-oxide semiconductor ("CMOS") technology.

The stable NVRS provided by the disclosed TMD and h-BN 2DNS devices is unexpected in monolayers because leakage currents are known to compromise resistance switching in ultra-thin bulk oxides. The unexpected results of atomically-thin TMD and h-BN sheets may be due to the crystalline nature and sharp interfaces with electrodes to prevent excessive leakage and the stable ionic effects. Stable NVRS may be generally attributed to ionic diffusion, filament and interfacial redox in bulk oxides and electrolytes.

2DNS devices providing NVRS have diverse applications, for example, in non-volatile flexible memory fabrics, zero static power radio-frequency ("RF") switching, memristor circuits and brain-inspired (neuromorphic) computing. These 2DNS devices may solve many challenges and issues present in current technologies, including issues such as device integration, power consumption and process cost. Because these 2DNS devices demonstrate stable NVRS, they are particularly beneficial in applications related to ion transport, energetics, and reactions at the sharp interfaces between sub-nanometre atomic sheets and conducting electrodes.

Hexagonal boron nitride (hBN) has a large bandgap, high phonon energies and an atomically smooth surface absent of dangling bonds. As a result, it has been widely used as a dielectric to investigate electron physics in two-dimensional heterostructures and as a dielectric in the fabrication of two-dimensional transistors and optoelectronic devices. hBN can be used to create analogue switches for applications in communication systems across radio, 5G and terahertz frequencies based on the non-volatile resistive switching capabilities of atomically thin hBN. Such switches within the present disclosure are composed of monolayer hBN sandwiched between two gold electrodes and exhibit a cutoff-frequency figure of merit of around 129 THz with a low insertion loss dB) and high isolation dB) from 0.1 to 200 GHz, as well as a high power handling (around 20 dBm) and nanosecond switching speeds, metrics that are superior to those of existing solid-state switches. Furthermore, the switches are 50 times more efficient than other non-volatile switches in terms of a d.c. energy-consumption metric, which is an important consideration for ubiquitous mobile systems. hBN switches may be used in a communication system with an 8.5 Gbit s$^{-1}$ data transmission rate at 100 GHz with a low bit error rate under $10^{-10}$.

Analogue switches are used in communication and connectivity systems to switch between different frequency bands, route signals between transmit and receive antennas, reconfigure wireless communication systems and form directional beams in phased-array networks. Conventional analogue and radio-frequency (RF) switches are based on solid-state diode or transistor devices, which are volatile and consume energy both during the relatively long static (standby) and short dynamic (switching) periods. Thus, switches that approach the ideal operation of zero d.c. power consumption, with finite energy only during a switching event are useful. This is of particular importance in mobile, wearable and battery-operated wireless systems.

To develop such an ideal switch, non-volatile memory devices, which include memristors, resistive random-access memory and phase-change memory, have been investigated intensely. The primary requirements of a memory device for high-frequency switching are a low on-state resistance ($R_{on}$«50Ω) to afford a low insertion loss, and a low off-state capacitance ($C_{off}$) to enable high isolation. Both parameters combine to yield a single cutoff frequency (FCO=½$\pi R_{on} C_{off}$) figure of merit in the terahertz range that is used to benchmark candidate switches. Additional metrics of practical importance include switching voltage, operation bandwidth, signal-power handling and switching time.

Atomically thin sheets of hexagonal boron nitride (hBN) configured in a metal-insulator-metal (MIM) 20-22 sandwich on a diamond substrate of the present disclosure can be used as analogue switches with a state-of-the-art performance with respect to the FCO (129 THz), bandwidth above 200 GHz, switching time and area scalability.

If one defines a d. c. energy consumption per switching event figure of merit, EFOM=$V_{set} I_{on} \tau$, where $V_{set}$ is the set voltage (~0.9 V), $I_{on}$ is the on current or maximum compliance current (~50 mA) and $\tau$ is the switching time (<15 ns). This metric is a useful estimate for benchmarking the energy efficiency of candidate switches for modern mobile systems, which are generally energy constrained. By this metric, the hBN switch (EFOM<0.68 nJ) is more energy efficient than conventional emerging switching devices by a factor of about 50 or more.

The high-speed data-transmission quality of hBN switches within the present disclosure may be validated using eye-diagram and bit error rate (BER) measurements for an 8.5 Gbit s$_{-1}$ data stream at a carrier frequency (fc) of 100 GHz. This data rate, although limited by the experimental set-up, is more than sufficient to meet the specified user experience data rate for 5G of 100 Mbit s$^{-1}$. The intrinsic data rate, which is dependent on the hBN operational bandwidth (>200 GHz), is similarly sufficient to satisfy the required peak data rate of 20 Gbit s$^{-1}$. Compared with monolayer $MoS_2$ switches (as described in Ge, R. et al. in 2018 IEEE International Electron Devices Meeting (IEDM) 22.6.1-22.6.4 (IEEE, 2018), incorporated by reference herein for comparative measurements with respect to monolayer $MoS_2$ switches switches), which have a similar MIM configuration, hBN switches offer ten times more power handling due to their superior thermomechanical properties. To further increase the thermal reliability and potentially higher power handling, optimized thermal management may be used to overcome Joule heating—a leading cause of device failure. A multiphysics simulation may be used in connection with hBN switches of the present disclosure to model the electrothermal performance and develop a route to optimize material and device co-design.

The present disclosure includes nanoscale non-volatile low-power analogue switches that are based on monolayer hBN and are suitable for applications in RF, 5G and terahertz communication and connectivity systems. The hBN high-frequency switches achieve a low insertion loss, high isolation (up to 220 GHz), and FCO values of about 129 THz due to their nanoscale vertical and lateral dimensions, which offer low resistance in the on state and low capacitance in the off state. For data communication systems, eye-diagram and BER measurements may show operation at a bit rate of 8.5 Gbit s$^{-1}$ and real-time video transmission.

Signal power handling is of primary importance in wireless transmitter systems. Compared with $MoS_2$ switches, hBN switches offer good linearity and power handling up to ~30 dBm in the on state, whereas off state power is limited by self-switching to ~20 dBm. The relatively high-power handling is due to the larger bandgap and thermomechanical stability of hBN. hBN switches of the present disclosure may be used in nanoscale energy-efficient high-frequency solid-state switch technology for the rapidly growing communication systems in the 5G band and beyond.

EXAMPLES

The following examples are provided to further illustrate specific embodiments of the disclosure. They are not intended to disclose or describe each and every aspect of the disclosure in complete detail and should be not be so interpreted. Unless otherwise specified, designations of cells lines and compositions are used consistently throughout these examples.

Figure 1:
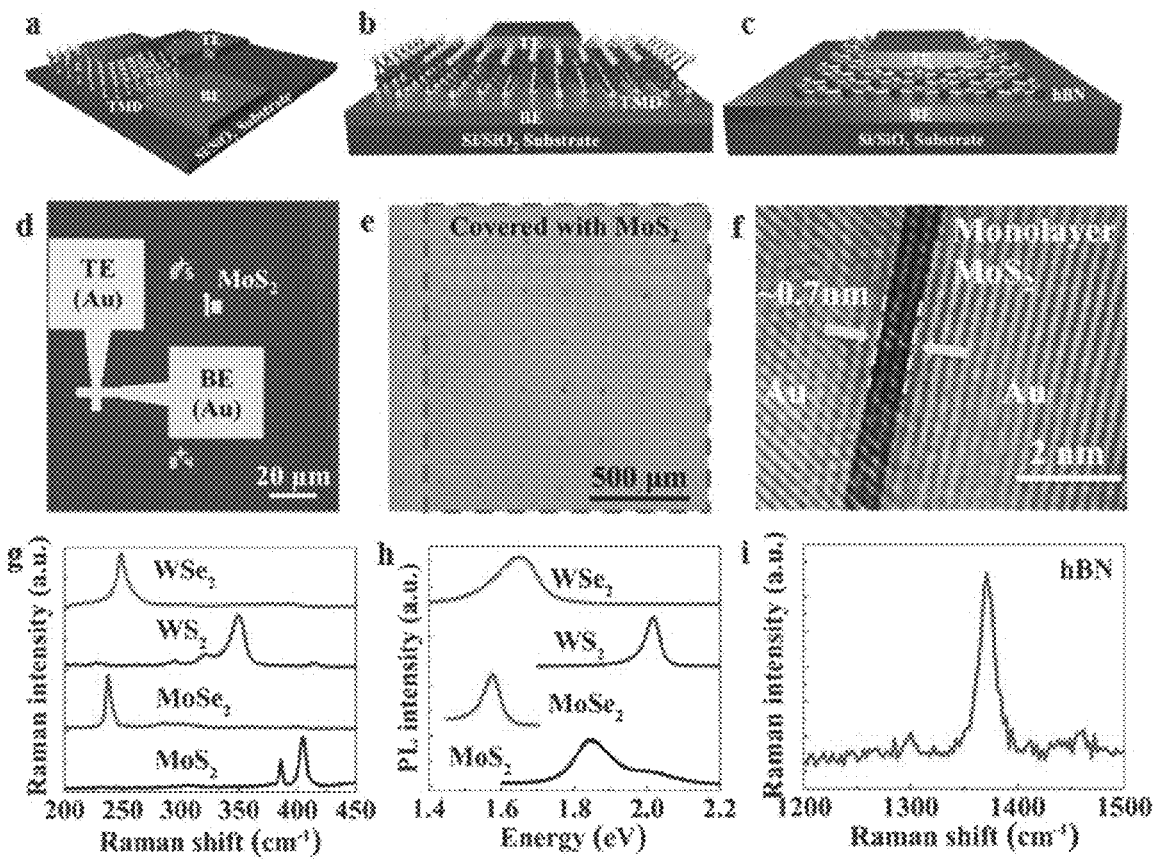
FIG. 1, Parts A-I, is a schematic representation of a transition metal dichalcogenide ("TMD") crossbar sandwich, TMD lithography-free ("litho-free") sandwich, and hexagonal boron nitride ("h-BN") transfer-free sandwich metal-insulator-metal ("MIM") devices, including optical images and graphs of Raman and Photoluminescence ("PL") spectrum of the devices.

In the examples described below, 2D material synthesis was performed by CVD and MOCVD techniques to generate monolayer atomic sheets of TMD's ($MoS_2$, $MoSe_2$, $WS_2$, and $WSe_2$) and h-BN. The TMD monolayer atomic sheets were subsequently transferred onto device substrates, which were used to fabricate 2DNS devices with vertical MIM configuration as illustrated in FIG. 1, Parts A-C. These 2DNS devices were then characterized and tested for NVRS, with results shown in figures below. FIG. 1, Part A is a schematic representation of a TMD crossbar sandwich device. FIG. 1, Part B is a schematic representation of a TMD litho-free sandwich. FIG. 1, Part C is a schematic representation of a h-BN transfer-free sandwich. The h-BN was grown directly on Ni foil substrate and did not need to be subsequently transferred to a device substrate to be integrated into a 2DNS device with vertical MIM configuration. FIG. 1, Part D is an optical image of a TMD crossbar sandwich device that is an $Au/MoS_2/Au$ crossbar device. FIG. 1, Part E is an optical image of a TMD litho-free sandwich device on $Si/SiO_2$ substrate, with a dashed box that indicates the area covered with $MoS_2$. FIG. 1, Part F is a transmission electron microscopy ("TEM") cross-section image of a TMD litho-free sandwich device that is an $Au/MoS_2/Au$ litho-free device. Part F shows that the fabricated $Au/MoS_2/Au$ litho-free device has an atomically sharp and clean monolayer interface.

Example 1-2D Material Synthesis

To synthesize the 2D material, CVD-synthesized monolayer $MoS_2$ was grown on $SiO_2/Si$ substrate using sulfur and $MoO_3$ as precursors, at 850° C. for 5 minutes. In addition, certain samples including $MoS_2$, $MoSe_2$, $WS_2$ and $WSe_2$ were grown by wafer-scalable MOCVD. The MOCVD monolayer synthesis was carried out in a hot-wall quartz tube furnace with a 4.3-inch inner diameter. Molybdenum hexacarbonyl ($Mo(CO)_6$, MHC, Sigma Aldrich 577766), tungsten hexacarbonyl ($W(CO)_6$, THC, Sigma Aldrich 472956), diethyl sulphide ($C_4H_{10}S$, DES, Sigma Aldrich 107247) and dimethyl selenide were the chemical precursors for Mo, W, S and Se, respectively. The growth was performed at 500° C. for 24 hours. The flow rate of precursors, which was regulated by individual mass flow controllers, were 0.01 sccm (standard cubic centimeter per minute) for MHC or THC, 0.3 sccm for DES, 1 sccm for H2, and 150 sccm for Ar. The total pressure during the growth was approximately 12 torr. NaCl was loaded in the upstream region as a desiccant to dehydrate the growth chamber.

Raman and photoluminescence spectroscopy was performed on these 2D materials in a Renishaw in-Via spectrometer, containing a 532 nm green laser. FIG. 1, Parts G-H show the results of the Raman and PL spectroscopy. FIG. 1, Part G is a graph of a Raman spectrum showing Raman shift ($cm^{-1}$) versus Raman intensity (a.u.) of MOCVD-grown monolayer $MoS_2$, $MoSe_2$, $WS_2$ and $WSe_2$, used in MIM device analysis. FIG. 1, Part H is a graph of a PL spectrum showing energy (eV) versus PL intensity (a.u.) MOCVD-grown monolayer $MoS_2$, $MoSe_2$, $WS_2$ and $WSe_2$, used in MIM device analysis. FIG. 1, Part I is a graph of a Raman spectrum showing Raman shift ($cm^{-1}$) versus Raman intensity (a.u.) of CVD-grown h-BN.

The h-BN was synthesized by CVD on Ni foil substrates, which were folded into a Ni enclosure. Ammonia borane powder precursor was heated separately, above its decomposition temperature, resulting in at least partially decomposed precursor. The decomposing ammonia borane powder precursor was carried by 5 sccm $H_2$ to the Ni foil substrate in the furnace at 1050° C. The process used was a carbothermal reduction process where 5 sccm methane ($CH_4$) gas was also flowed. The carbon from the methane gas generally does not incorporate into the h-BN, but rather helps to reduce boron oxide. After 5 minutes, the furnace and the methane gas and decomposing ammonia borane powder precursor sources were shut off, and the sample was cooled under 5 sccm $H_2$. The total pressure of the system during synthesis was approximately 200 mTorr.

Example 2-2D Material Transfer and 2DNS Device Fabrication

The crossbar device fabrication started with BE patterning by electron beam lithography and 2 nm Cr/60 nm Au metal stack deposition on an $SiO_2/Si$ (285 nm) substrate, forming a fabricated substrate. While the litho-free device employs global electrode (2 nm Cr/60 nm Au) as BE, single-layer TMD was transferred onto the target substrate using resist-free polydimethylsiloxane ("PDMS") stamp transfer method, as shown in FIG. 2. FIG. 2 is a schematic diagram of PDMS-assisted pick-and-place transfer fabrication, using TMD. In this PDMS stamp transfer process, the monolayer TMD was brought into conformal contact with PDMS, forming a substrate-TMD-PDMS system. The substrate-TMD-PDMS system was soaked in diluted water. Because the original substrate ($SiO_2$) is hydrophilic, the diluted water may diffuse into the TMD-substrate interface, which separates the two layers. The PDMS-TMD film was brought into contact with the target fabricated substrate. The PDMS stamp was then peeled off to leave monolayer TMD films on the target substrate.

The CVD h-BN was transferred from the Ni foil substrate using a poly(methyl methacrylate) ("PMMA")-assisted wet transfer method. A thin layer of PMMA was spin coated onto the h-BN/Ni and then the Ni was etched away using an etchant, which in this case was 0.5 M ammonia persulfate solution. The PMMA/h-BN was rinsed in deionized ("DI") water to remove any etchant by-product prior to lifting with the target substrate.

For crossbar devices, TE, using the same fabrication process as BE, was patterned and deposited. In contrast, for the litho-free device, the TE (60 nm Au) was deposited via laser shadow mask.

Example 3-2DNS Material Characterization

Materials from Examples 1 and 2 were used in Example 3.

The fabricated 2DNS crossbar devices with TMD or h-BN atomic sheets, and Au bottom and top electrodes were subjected to DC electrical measurements and revealed non-volatile resistance switching in the monolayer $MX_2$ and h-BN active layers, as shown in FIG. 3. FIG. 3, Parts A-L, is representative graphs of voltage (V) versus current (A) of monolayer TMD and h-BN 2DNS devices.

FIG. 3, Part A is a graph of voltage (V) versus current (A), showing bipolar resistive switching in a monolayer $MoS_2$ crossbar device, with an area of 2×2 $\mu m^2$. In Part A, Step 1 shows that as voltage increases from 0 to 1.2 V. At ~1V, the current abruptly increases to compliance current, indicating a transition ("SET") from high resistance state ("HRS") to low resistance state ("LRS"). At Step 2, voltage decreases from 1.2 V to 0. The device remains in LRS. At Step 3, voltage increases from 0 to −1.5 V. At −1.25 V, the current abruptly decreases, indicating a transition ("RESET") from LRS to HRS. At Step 4, voltage decreases from −1.5 V to 0. The device remains in HRS until the next cycle.

FIG. 3, Part B is a graph of voltage (V) versus current (A) of a $MoS_2$ crossbar device, with an area of 2×2 $\mu m^2$, at a high resistance state. Part C is a graph of voltage (V) versus current (A) of a $MoS_2$ crossbar device, with an area of 2×2 $\mu m^2$, at a low resistance state. The READ operations at HRS and LRS, shown in Parts B and C confirm non-volatility of the device. Part D is a graph of voltage (V) versus current (A), showing unipolar resistive switching in a $MoS_2$ crossbar device, with an area of 2×2 $\mu m^2$. FIG. 3, Part D shows that for unipolar operation, both SET and RESET transitions are achieved under positive bias.

The four types of single-layer $MX_2$ ($MoS_2$, $MoSe_2$, $WS_2$, and $WSe_2$) were investigated and all showed similar characteristics of (predominantly) bipolar switching, and (occasional) unipolar switching as illustrated in FIG. 3, Parts E-J. The co-existence of unipolar and bipolar switching is likely influenced by several parameters including lateral area, grain size, and compliance conditions. Similar qualitative results were achieved with h-BN (FIG. 3, Parts K and L).

These collective results of NVRS in representative atomic sheets indicates NVRS capability in all non-metallic 2D nanomaterials. FIG. 3, Part E is a graph of voltage (V) versus current (A), showing bipolar resistive switching in a monolayer $MoSe_2$ crossbar device, with an area of 0.4×0.4 $\mu m^2$. Part F is a graph of voltage (V) versus current (A), showing unipolar resistive switching in a monolayer $MoSe_2$ crossbar device, with an area of 0.4×0.4 $\mu m^2$. Part G is a graph of voltage (V) versus current (A), showing bipolar resistive switching in a monolayer $WS_2$ crossbar device, with an area of 2×2 $\mu m^2$. Part H is a graph of voltage (V) versus current (A), showing unipolar resistive switching in a monolayer $WS_2$ crossbar device, with an area of 2×2 $\mu m^2$. Part I is a graph of voltage (V) versus current (A), showing bipolar resistive switching in a monolayer $WSe_2$ crossbar device, with an area of 2×2 $\mu m^2$. Part J is a graph of voltage (V) versus current (A), showing unipolar resistive switching in a monolayer $WSe_2$ crossbar device, with an area of 2×2 $\mu m^2$. Part K is a graph of voltage (V) versus current (A), showing bipolar resistive switching in a monolayer h-BN crossbar device, with an area of 1×1 $\mu m^2$. Part L is a graph of voltage (V) versus current (A), showing unipolar resistive switching in a monolayer h-BN crossbar device, with an area of 1×1 $\mu m^2$. Because FIG. 3, Parts E-L demonstrate both bipolar and unipolar resistive switching in $MoSe_2$ (Parts E and F), $WS_2$ (Parts G and H), $WSe_2$ (Parts I and J), and h-BN (Parts K and L) 2DNS crossbar MIM devices, these results indicate both bipolar and unipolar non-volatile resistive switching in devices containing monolayer TMD and h-BN atomic sheets, respectively.

With the TMD $MoS_2$, shown in FIG. 3, Part A, the low currents featured correspond to a HRS until the application of ~1V, which SET the atomic-layer switch to a low-resistance state that persists until a negative voltage is applied to RESET it. Because a negative voltage must be applied to RESET the device, it is stable at each state, HRS and LRS. Accordingly, the device may be described as stable and non-volatile. Absent electrical power, a typical atomic switch consumes zero static power and affords data retention under ambient conditions (FIG. 4, Parts A-D), more than 100× longer than previously reported lateral counterpart.

In FIG. 3, Part B, low-voltage 'READ' characteristics of the HRS clearly exhibit a linear profile, which can be understood from quantum-mechanical direct electron tunneling across a potential barrier yielding a linear relation, $$I \propto KV\exp\left(\frac{-4\pi d\sqrt{2m*\varphi}}{h}\right),$$

where m* is the electron effective mass, $\varphi$ is the barrier height, h is Planck's constant, and K is proportional to the lateral area (A) and dependent on the barrier parameters (m*, $\varphi$, d). d is the barrier thickness, which is ~7 Å for a monolayer. Direct tunneling dominates in the absence of trap-assisted tunneling ("TAT"). The READ profile of the LRS is similarly linearly (FIG. 3C), which is a manifestation of a field-induced conductive link between the electrodes. Area scaling studies (described in FIG. 8, below) indicate the conductive link is of a localized nature that is relatively invariant.

FIG. 4, Parts A-D, is graphs of retention time of monolayer TMD's and h-BN crossbar (non-volatile switch) devices. FIG. 4, Part A is a graph of retention time (s) versus resistance ($\Omega$) of a monolayer $MoS_2$ crossbar device with an area of 10×10 $\mu m^2$, at room temperature. Part B is a graph of retention time (s) versus resistance ($\Omega$) of a monolayer $MoSe_2$ crossbar device with an area of 0.4×0.4 $\mu m^2$, at room temperature. Part C is a graph of retention time (s) versus resistance ($\Omega$) of a monolayer $WS_2$ crossbar device with an area of 2×2 $\mu m^2$, at room temperature. Part D is a graph of retention time (s) versus resistance ($\Omega$) of a monolayer h-BN crossbar device with an area of 2×2 $\mu m^2$, at room temperature. In Parts A-D of FIG. 4, the resistance of HRS and LRS was determined by the current read at 0.1 V.

In FIG. 4, interestingly, the single-layer non-volatile switch required no electro-forming step, a prerequisite in transitional metal oxides ("TMOs") to initialize a soft dielectric breakdown that forms a conductive filament for subsequent NVRS operation, although, can be avoided with thickness scaling into the nm-thicknesses, with excessive leakage current from TAT a limiting consequence. In the fabricated 2DNS devices, an ON/OFF ratio above $10^4$ can be achieved, highlighting a defining advantage of clean crystalline monolayers over defective ultrathin amorphous oxides.

FIG. 5, Parts A-D, is graphs of voltage (V) versus current (A) of a monolayer $MoS_2$ non-volatile sandwich device under different device conditions. FIG. 5, Part A is a graph of voltage (V) versus current (A) of a monolayer litho-free Au/$MoS_2$/Au device with a lateral area of 20×20 $\mu m^2$. Part B is a graph of voltage (V) versus current (A) of a single-crystal $MoS_2$ device with Au electrodes. The optical microscope image of the single-crystal $MoS_2$ device of FIG. 5, Part B is shown in FIG. 7, Part B. Part C is a graph of voltage (V) versus current (A) of a $MoS_2$ litho-free device using silver as top and bottom electrodes. Part D is a graph of voltage (V) versus current (A) of a $MoS_2$ crossbar device using graphene as the top electrode and gold as bottom electrode. The area of the graphene/$MoS_2$/Au device was 1×1 $\mu m^2$.

In most of the experiments, Au was used as an inert electrode to rule out interfacial metal oxides. Here, devices of identical processing with Au electrodes on the same substrate but without TMD layer did not reveal NVRS (FIG. 6). FIG. 6 is a graph of voltage (V) versus current (A) for a test crossbar (non-volatile switch) device that does not contain an 2D active layer. The structure of the test crossbar device is Au (60 nm)/Cr (2 nm)/Au (60 nm). In this structure, Cr serves as the adhesion layer in the lift-off process. In contrast to FIG. 4, no resistive switching behaviour is demonstrated in FIG. 6, indicating that the TMD or h-BN active layer plays the primary role in such resistive switching behaviour.

To exclude the undesired participation of polymer contamination from microfabrication, litho-free devices produced the NVRS effect (FIG. 5, Part A), as well as transfer-free devices (FIG. 7, Part A). Line or grain boundary defects in polycrystalline 2D multi-layers play an intrinsic role in switching. However, while this is a possible factor in monolayers, it is not an exclusive factor as shown in FIG. 5, Part B from an MIM device realized on a single-crystal (boundary-free) CVD $MoS_2$ (FIG. 7, Part A), highlighting the consideration of localized effects.

FIG. 7, Parts A-C, is representative graphs of graph of voltage (V) versus current (A) for a test crossbar (non-volatile switch) device and an optical image of different device structures. Part A is a representative graph of voltage (V) versus current (A) for a litho-free 4-layer $MoS_2$ device, using chromium (Cr) as both top and bottom electrodes. The area of this Cr/$MoS_2$/Cr litho-free device is 15×15 $\mu m^2$ and HRS tunnel resistance is ~2.4 $G\Omega$-$\mu m^2$. Part B is a representative graph of voltage (V) versus current (A) for a litho-free h-BN MIM devices, using Ni foil as the bottom electrode and Au as the top electrode. The h-BN layer was grown on Ni foil, so no transfer process was required. The area of this litho-free h-BN device is 10×10 µm$^2$ and HRS tunnel resistance is ~0.6 MΩ-µm$^2$. Part C is an optical microscope image of a single crystalline monolayer MoS$_2$ MIM device, with Au top and bottom electrodes.

NVRS in the fabricated devices is not restricted to inert electrodes because monolayer TMD with electrochemically active (Ag) electrodes, still demonstrates NVRS as presented in FIG. 5, Part C (see FIG. 7, Part C for devices with Ni and Cr electrodes). Furthermore, monolayer graphene electrode is also a suitable option (FIG. 5, Part D). This indicates a potential application of atomically-thin sub-nanometre 2DNS in ultra-flexible and dense intelligent non-volatile computing fabrics.

Mechanisms of Action

To examine the underlying mechanism(s), electrical measurements over four degrees of freedom were conducted: area scaling; compliance current; voltage sweep rate; and layer thickness dependence. MoS$_2$ was used because of its greater maturity.

Area scaling studies clearly show distinct profiles with the LRS relatively flat while the HRS features a more complex relation (FIG. 8, Part A). FIG. 8, Parts A-F, is graphs of area scaling, compliance current, sweep rate, layer thickness, and current sweep operation of a monolayer MoS$_2$ non-volatile switching device. Part A is a graph of area (µm$^2$) versus resistance (Ω) of a monolayer MoS$_2$ device with Au/MoS$_2$/Au structure, with resistance of LRS and HRS states determined at a low voltage of 0.1 V. FIG. 8, Part A shows area-dependence of low and high resistance states in the MoS$_2$ device with Au/MoS$_2$/Au structure. Part B is a graph of voltage (V) versus current (A) of a MoS$_2$ litho-free 2DNS device. FIG. 8, Part B shows dependence of the READ current on the compliance current after the SET process in the MoS$_2$ litho-free 2DNS device. In particular, Part B demonstrates that four separate resistance states (three ON states and one OFF state) may be obtained in a single MoS$_2$ litho-free 2DNS device by varying the compliance current at 20 mA (ON state I), 40 mA (ON state II), and 80 mA (ON state III). Part C is a graph of compliance current (mA) versus resistance at a low resistance state (Ω) of a MoS$_2$ litho-free 2DNS device, with a fitting curve obtained using an inverse quadratic model, y∝x^(−2). FIG. 8, Part C shows the relationship between LRS resistance and compliance current indicating a sub-10Ω resistance is achievable for RF switch applications. Part D is a graph of sweep rate (V s$^{-1}$) versus SET/RESET voltage (V) of a MoS$_2$ litho-free 2DNS device, with an area of 15×15 µm$^2$. FIG. 4, Part D shows that the SET and RESET voltages depend on the sweep rate. Part E is a graph of voltage (V) versus current (A), showing layer dependent I-V characteristics of 2, 3, and 4-layer MoS$_2$ litho-free MIM devices, each with an area of 15×15 µm$^2$. Part F is a graph of layer number versus resistance at a low resistance state (Ω), with the straight line on the graph added as a visual guide. FIG. 8, Part F shows the relationship between LRS resistance and layer number of few-layer MoS$_2$ litho-free devices. In particular, as the layer number increases, LRS resistance increases.

The LRS profile shown in FIG. 8 is consistent with the theory of a single (or few) localized filament(s). In areas of less than 100 µm$^2$, the HRS resistance scales inversely with area, R∝1/A, as discussed earlier with respect to FIG. 3, Part B. For larger areas, the resistance becomes area-invariant attributed to the emergence of grain boundaries. The domain size of the CVD-grown MoS$_2$ monolayer in the described experiments is ~10$^2$-10$^3$ µm$^2$. Together, the HRS resistance may be understood from a linear-constant model, linear for devices less than the grain size, and approximately constant for larger sizes owing to TAT at grain boundaries. The SET/RESET voltage to area scaling is presented in FIG. 9.

FIG. 9 is a graph of current (mA) versus voltage (V), showing the current sweep SET operation of a monolayer MoS$_2$ crossbar device with an area of 10×10 µm$^2$, with an inset graph of voltage (V) versus current (mA) for the same device. In FIG. 9, the current increases from 0 to 30 mA and then decreases to 0. The voltage increases with current until the voltage reaches 0.65 V, and then suddenly drops to around 0.2 V, which indicates the first resistance decreasing process (SET) is at 0.65 V. As the current decreases from 30 to 0 mA, the voltage follows a linear decreasing step back to 0 V, and shows that there are five separate SET steps. The inset voltage sweep graph, showing voltage (V) versus current (A) for the same monolayer MoS$_2$ crossbar device, shows a SET voltage of 0.63 V, which corresponds with the first transition in current sweep at 0.65 V.

FIG. 10 is a graph of voltage (V) versus current (A) for low compliance current operation of a h-BN crossbar device, with an area of 2×2 µm$^2$. In FIG. 10, the compliance current during the SET process was 1 mA, 100 µA and 10 µA, respectively. FIG. 10 shows that the h-BN crossbar device is capable of operating at low compliance current, which demonstrates that the device may be used for low-power non-volatile resistance switching.

FIG. 11 a graph of SET and RESET voltages (V) versus area (µm$^2$) for MoS$_2$ crossbar devices. FIG. 11 demonstrates the dependence of SET and RESET voltages on area. In particular, as the device area increases, the SET voltage decreases from 3 V to 0.5 V, while the RESET voltage remains relatively flat around −1 V.

The current and resistance dependence on compliance current (FIG. 8, Parts B and C) reveals a linear scaling that may be attributed to an increase in the cross-sectional area of a single filament or to the formation of multiple filaments. For applications, the programmable resistance states are suitable for multilevel memory. In addition, the intrinsic low resistance values, approaching ~5Ω (FIG. 8, Part C), allows for applications in nanoscale low-power non-volatile RF switches. The dependence of the SET/RESET voltages on sweep rate (FIG. 8, Parts D) suggests that slower rates affords more time for ionic diffusion resulting in reduced voltages, an important consideration for low-voltage operation.

Layer dependent studies up to four layers (FIG. 12) demonstrate that NVRS persists (FIG. 8, Parts E) even with multiple layers, with a distinction that the LRS increases with layer number (FIG. 8, Parts F). FIG. 12, Parts A-B, is a Raman and PL spectrum of one to four-layer MoS$_2$ thin films. Part A is a graph of a Raman spectrum showing Raman shift (cm$^{-1}$) versus Raman intensity (a.u.) of one to four-layer MoS$_2$ thin films. For each of the one to four layers, the two most prominent peaks shown are the E$^1_{2g}$ (left peak) and A$_{1g}$ modes (right peak). The Raman shift of the E$_{2g}$ mode decreases whereas that of the A$_{1g}$ mode increases with increasing layer number. Part B is a PL spectra showing energy (eV) versus PL intensity (a.u.) of one to four-layer MoS$_2$ thin films, and with the intensity of two to four-layer MoS$_2$ spectra magnified by 10× for visibility. FIG. 12, Part B shows that PL intensity decreases with increasing layer number.

The fabricated devices were also measured on a Cascade or Lakeshore probe station with an Agilent 4156 semiconductor parameter analyzer under ambient conditions. Raman and photoluminescence ("PL") spectroscopy were performed on a Renishaw in-Via system using a 532 nm wavelength source. Scanning electron microscope ("SEM") images were collected on a ZEISS Neon 40 microscope with a beam at 5 kV energy. X-ray photoelectron spectroscopy was performed with an Omicron Multiprobe system with a monochromatic Al Kα (hv=1486.7 eV) x-ray source. The measurement was taken at room temperature with a background pressure below $3\times10^{-10}$ mbar.

FIG. 13 is a SEM image of MOCVD monolayer $MoS_2$. FIG. 14, Parts A-E, is an SEM image and X-ray photoelectron spectroscopy ("XPS") characterization of as-grown CVD h-BN. FIG. 14, Part A is an SEM image of as-grown CVD h-BN. The coverage of monolayer h-BN is calculated to be 82.8% based on an optical microscope image covering $7\times10^4$ um$^2$. Part B is an optical microscope image of an h-BN crossbar device. The dashed line indicates the presence of adlayer, which is an adsorbed layer that is chemically interacting with the substrate. The rest of the image shown in Part B is filled with monolayer h-BN. Part C is a graph of binding energy (eV) versus counts per second, showing results obtained from XPS of as-grown h-BN. The "B 1s" peak corresponds to that which is expected for h-BN at 190.5 eV. Part D is a graph of binding energy (eV) versus counts per second, showing results obtained from XPS of as-grown h-BN. The "C 1s" peak is attributed to C—C bonds from adventitious carbon contamination. Part E is a graph of binding energy (eV) versus counts per second, showing results obtained from XPS of as-grown h-BN. The "O 1s" peak is attributed to C—O bonds also from surface contamination due to ambient conditions. Part F is a graph of binding energy (eV) versus counts per second, showing results obtained from XPS of as-grown h-BN, and including fitted curves 1-3.

Potential Applications

With regard to next-generation solid-state memory, 2DNS devices offers distinct advantages in terms of ultimate vertical scaling down to an atomic layer and forming-free operation. With the replacement of metal electrodes with graphene, the entire memory cell may be scaled below 2 nm. Further, the transparency of graphene and the unique spectroscopic features of 2D materials allows direct optical characterization for in-situ studies and in-line manufacturing testing.

FIG. 15, Parts A-D, is graphs of performance characteristics of a $MoS_2$ crossbar MIM device. Part A is a graph of cycle number versus resistance (Ω), showing endurance distribution of a $MoS_2$ crossbar MIM device, with 150 manual DC switching cycles. Part B is a graph of cycle number versus resistance (Ω), showing resistance distribution of a $MoS_2$ crossbar MIM device, with 150 manual DC switching cycles. Part C is a graph of time (s) versus resistance (Ω) of a $MoS_2$ crossbar device, with an area of $2\times2$ μm$^2$, and with the resistance of the HRS and LRS determined by current read at 0.1 V, at room temperature. Part D is a graph of frequency (GHz) versus S21—Loss (dB) and S21—Isolation (dB), showing RF simulation results in a 50Ω system for a 2DNS switch with a DC $R_{on}$ of 5Ω and a parallel-plate $C_{off}$ of 40 fF/μm$^2$, the system representative of a MIM device with area 0.1×0.1 μm$^2$.

The RF simulation of a 2DNS switch described in FIG. 15, Part D, with a realistic DC $R_{ON}$~5Ω and parallel-plate MIM capacitance, $C_{OFF}$~40 fF/μm$^2$, demonstrates sub-THz operation with insertion loss less than 1 dB and isolation greater than 30 dB. A dielectric constant of 4 was used for $MoS_2$. Furthermore, a figure of merit ("FOM") for evaluating RF switches is the cut-off frequency, $f_{co}=1/(2\pi R_{ON}C_{OFF})$, resulting in an area-normalized value of ~0.8 THz-um$^2$. Importantly, the unique combination of (approximately) area-independent LRS resistance and area-dependent HRS capacitance, yields a FOM that can be scaled to 100's of THz by reduction of device area, in sharp contrast to conventional phase-change switches, in which capacitance is proportional to width but $R_{ON}$, inversely dependent, hence, preventing frequency scalability without significantly compromising loss. Furthermore, the high breaking strain and ease of integration of 2D materials on soft substrates can afford flexible non-volatile digital, analog and RF switches that can endure mechanical cycling.

Manual endurance data, as shown in FIG. 15, Parts A and B, indicates that improvement of endurance in the 2DNS devices will assist in meeting the stringent requirements for solid-state memory. To improve endurance, oxygenation by interface engineering or doping may be beneficial, with similar effects as those observed for amorphous-carbon memory devices.

Nonetheless, retention of non-volatile states tested up to a week (FIG. 15, Part C) appears consistent with the requirements for certain neuromorphic applications, in particular those involving short and medium term plasticity. Moreover, the sub-nanometre thinness of monolayers is promising for realizing ultra-scaled areas and volume down to $1\times1$ nm$^2$ and 1 nm$^3$, respectively. At this limit, a very loose 2DNS density of $10^{15}$/mm$^3$ may provide ample room to mimic the density of human synapses (~$10^9$/mm$^3$).

2DNS devices may also be used in applications involving non-volatile low-power RF switches because of their low voltage operation, small form-factor, fast switching speed, and low-temperature integration compatible with Si or flexible nanotechnology, in contrast to existing switches that are transistor or micro-electromechanical devices. Such prior devices are volatile, and micro-electromechanical devices require large switching voltages, which are sub-optimal for portable technologies. Further, existing phase-change switches have limited utility because of their high-temperature melting requirement and slow switching times FIG. 16, Parts A-C, is a dynamic mechanical analysis ("DMA") and graph of voltage (V) versus current (A) of a bilayer $MoS_2$ crossbar devices on PI substrate, before and after bending via DMA apparatus. Part A is a photographic image of a bent bilayer $MoS_2$ crossbar device on polyimide ("PI") substrate via DMA apparatus. Part B is a schematic diagram of the bent $MoS_2$ device, produced by the DMA apparatus shown in Part A, sandwiched by gold electrodes on flexible substrate. Part C is a graph of voltage (V) versus current (A) of a bilayer $MoS_2$ crossbar device on PI substrate, before and after bending via DMA apparatus. Part C shows typical switching I-V curves of bilayer $MoS_2$ crossbar devices before and after 1000 cycles at 1% strain. FIG. 16 demonstrates that 2DNS devices are beneficial in applications such as flexible fabric memories, which require bending the device.

Method Figures

As discussed in Examples 1 and 2, above, FIGS. 17 and 18 illustrate methods for synthesizing monolayer atomic sheets of TMD and h-BN, respectively, for use in 2DNS devices.

FIG. 17 is a flowchart of a method 1700 for synthesizing a semiconducting monolayer crystalline non-metallic atomic sheet on a target substrate, where the monolayer atomic sheet includes a TMD. In method 1700, at step 10, a monolayer atomic sheet TMD layer is grown on an initial substrate layer. The initial substrate layer, on which the TMD layer is grown, may be any hydrophilic substrate. For example, the initial substrate layer may be a $SiO_2$/Si substrate, and the monolayer atomic sheet may be grown, for example, by CVD or MOCVD. To perform step 10, the TMD may include a composition with a general formula $MX_2$, where M is Molybdenum or Tungsten, and X is Sulphur, Selenium or Tellurium. For example, the TMD may include $MoS_2$, $MoSe_2$, $WS_2$, or $WSe_2$. In one example, Molybdenum hexacarbonyl ($Mo(CO)_6$, MHC, Sigma Aldrich 577766) may be used as a precursor for M; tungsten hexacarbonyl ($W(CO)_6$ THC, Sigma Aldrich 472956) may be used as precursor for W; diethyl sulphide ($C_4H_{10}S$, DES, Sigma Aldrich 107247) may be used as precursor for S; and dimethyl selenide may be used as precursor for Se. In this example, the TMD may be grown by MOCVD monolayer synthesis, carried out in a hot-wall quartz tube furnace with 4.3 inch inner diameter, with growth performed at 500° C. for 24 hours. The flow rate for each precursor may be regulated by individual mass flow controllers, and may be 0.01 sccm for MHC or THC, 0.3 sccm for DES, 1 sccm for H2, and 150 sccm for Ar. Further, the total pressure during the growth may be approximately 12 torr, and NaCl may be loaded in the upstream region as a desiccant to dehydrate the furnace. In another example, $MoS_2$ may be grown on $SiO_2$/Si substrate using sulfur and $MoO_3$ as precursors, at 850° C. for 5 minutes, in a furnace.

At step 15, a polydimethylsiloxane (PDMS) layer is grown on the TMD layer. At step 20, the PDMS layer, TMD layer, and initial substrate layer is soaked in a solvent. Any solvent suitable to separate the initial substrate layer from the TMD layer may be used, for example, DI water. At step 25, the initial substrate layer is separated from the TMD layer. At step 30, a target substrate layer is grown on the TMD layer. At step 35, the PDMS layer is removed from the TMD layer, to form a semiconducting monolayer crystalline non-metallic atomic sheet including the TMD layer on the target substrate layer. The PDMS layer may be removed, for example, by peeling it from the TMD layer. The formed semiconducting monolayer crystalline non-metallic atomic sheet including TMD may be operable to perform stable non-volatile resistance switching, and may further be operable to perform unipolar and bipolar switching.

FIG. 18 is a flowchart of a method for synthesizing a semiconducting monolayer crystalline non-metallic atomic sheet on a target substrate, where the monolayer atomic sheet includes h-BN. At step 40, a monolayer atomic sheet h-BN layer is grown on an initial substrate layer. The initial substrate layer may be a Ni foil substrate, and the monolayer atomic sheet h-BN layer may be grown, for example, by CVD. To perform step 40, ammonia borane powder precursor, for example, may be heated separately above its decomposition temperature to cause decomposition. The decomposing precursor may then be carried by 5 sccm $H_2$ to the Ni foil substrate in a furnace at 1050° C. In this carbo-thermal reduction process, 5 sccm $CH_4$ gas may also be flowed into the furnace. The carbon from the $CH_4$ gas does not incorporate into the h-BN; instead, helping to reduce the boron oxide. After 5 minutes, the furnace and the $CH_4$ gas and ammonia borane precursor sources may be turned off and the system may be cooled under 5 sccm $H_2$. The total pressure of the system during synthesis may be, for example, roughly 200 mTorr.

At step 45, a layer of poly(methyl methacrylate) (PMMA) is spin-coated onto the h-BN layer. At step 50, the initial substrate layer is etched away. The initial substrate layer may be etched away with, for example, 0.5 M ammonia persulfate solution. Further, any remaining etchant may be removed by rinsing the third system with DI water. At step 55, the h-BN layer is contacted with a target substrate layer. At step 60, the PMMA layer is removed from the h-BN layer, to form a semiconducting monolayer crystalline non-metallic atomic sheet including h-BN on the target substrate layer. The PMMA layer may be removed, for example, by peeling it from the h-BN layer. The formed semiconducting monolayer crystalline non-metallic atomic sheet including h-BN may be operable to perform stable non-volatile resistance switching, and may further be operable to perform unipolar and bipolar switching.

Example 4—hBN Switch Studies

The following materials and devices were used with the following methods of obtain the results described in this Example 4.

Device Fabrication and Characterization

ThBN RF switches according to the present disclosure were fabricated on 0.3-mm-thick polycrystalline CVD diamond substrate (from Element Six, thermal conductivity >1,000 W m-1 $K^{-1}$). The GSG device configuration was patterned by electron beam lithography. An electron-beam metal evaporation tool was used to create the ground pads and the BE, which consisted of 2-nm-thick chromium for the adhesion layer and 100-nm-thick Au. hBN atomic sheets were grown on copper foil using a standard CVD method (Kim, K. K. et al. Synthesis of monolayer hexagonal boron nitride on Cu foil using chemical vapor deposition, Nano Lett. 12, 161-166 (2012), incorporated by reference herein with respect to CVD method) and then transferred to the fabricated BE using a poly(methyl methacrylate)-assisted wet-transfer method. Then, electron beam lithography and a plasma etching process were used to define the active region of the hBN film. Lastly, the TE was patterned and deposited by using the same fabrication process as used for the BE.

The d.c. measurements were conducted on a Formfactor probe station with a Keysight 4156 semiconductor parameter analyser under ambient conditions. An array of devices was prepared and 18 devices worked out of 36 devices. Therefore, the yield was 50%. Yield is expected to increase further with engineering optimization of the material transfer process, device microfabrication and electrostatic discharge handling of the fabricated samples.

The Renishaw in-Via system with a 532-nm-wavelength source was used for monolayer hBN Raman spectroscopy.

Atomic force microscopy images were collected using a Vecco Nanoscope with tapping mode.

RF measurements were conducted using a Keysight E5270 source meter unit and various VNAs with Formfactor Infinity GSG probes. R&S ZVA24 with a frequency converter, a ZVA110 and an Agilent E8361A VNA were used to cover 0.1-110 GHz and 140-220 GHz bands. The sample was placed on top of an absorber (from Formfactor) to avoid coupling to the sample holder. The source RF power was set to −16 dBm, which is in the small signal range for S-parameter measurements to avoid non-linear effects. For on-wafer calibration, SOLT calibration was used for the 67 GHz set-up and LRRM calibration was used for the 220 GHz set-up, and calibrations were carried out using a Cascade calibration kit and WinCal software (Formfactor Inc.) to obtain precise results and to remove the parasitic effects of impedances that arise from the cables and probe station as described in Application Note on Wafer Vector Network Analyzer Calibration and Measurements (Cascade Microtech, 1997), incorporated by reference herein with respect to its description of how to calibrate and obtain measurements.

The S parameters were measured in the on and off states. As the hBN switch device has a non-volatile resistive switching phenomenon, a forward and reverse d.c. bias was applied to turn on and off the switching device, respectively. Therefore, the forward d.c. bias (set voltage) was used to switch the device from the off state to the on state at first. Then the S parameter of the on state was measured using a VNA without a d.c. bias. Afterwards, the reverse d.c. bias (reset voltage) was applied to turn off the device. Similarly, the S parameter of the device was measured at the off state using a VNA without d.c. bias. An open-short de-embedding process was used to remove the pad and interconnect resistances. RF power handling was measured using a Keysight PNA-X VNA with Formfactor Z probes. A continuous-wave signal with power levels from −20 to +30 dBm at 40 GHz was applied to evaluate the power-handling capability in both the on and off states by measuring a/b parameters and power inputs and outputs at the device.

Structure, Characterization, and D.C. Resistive Switching

FIG. 19 shows the device structure and optical characterization of a monolayer hBN RF switch fabricated on a 300-μm-thick polycrystalline diamond substrate that has a root-mean-square surface roughness less than 0.8 nm. In comparison with silicon or $SiO_2$/silicon substrates, the diamond was specifically chosen for its high thermal conductivity, which provide sufficient heat sinking to keep the hBN switch (and metal feedlines) relatively cool during d.c. and RF operation, an important criterion for reliable operation. The switch stack consists of ~150 nm gold (Au) top and bottom electrodes (TEs and BEs, respectively) both with 2 nm chromium adhesion layers. First, Bes with a ground-signal-ground (GSG) configuration for RF measurements were formed by lift-off after electron-beam lithography and electron-beam metal evaporation. Afterwards, chemical vapour deposited (CVD) hBN atomic sheets were transferred onto the BE using poly(methyl methacrylate)-assisted wet transfer methods of Wu, X. et al. Thinnest nonvolatile memory based on monolayer h-BN, Adv. Mater. 31, 1806790 (2019) and Lee, Y. H. et al. Synthesis and transfer of single-layer transition metal disulfides on diverse surfaces, Nano Lett. 13, 1852-1857 (2013), both incorporated by reference herein with respect to wet transfer methods.

The TE was prepared using the same fabrication process as for the BE. FIG. 19, Part A shows a top-view optical image of a GSG device configuration of an hBN RF switch with Au electrodes. FIG. 19, Part B is a magnified atomic force microscopy image of the device area of a vertical MIM structure. The overlap between the BE and TE defines the switch area, which in this case is 0.5×0.5 μm². A side-view schematic of the device MIM structure is shown in FIG. 19, Part C. Transmission electron microscopy confirms the crystalline honeycomb atomics structure of the synthesized monolayer hBN with a lattice constant of ~0.25 nm (FIG. 19, Part D). Furthermore, Raman spectroscopy of the CVD-grown hBN film corroborates the crystalline quality (FIG. 19, Part E). After fabrication, the device is initially in a high-resistance state (HRS). Electrical voltage stimulus reveals a sudden increase (set process) in the current (FIG. 19, Part F), which corresponds to a low-resistance state. It remains in that state, absent of power, until an opposite voltage polarity is employed to reset the device back to its initial state. As such, this type of MIM device is known as a bipolar non-volatile resistance switch or memory device.

High Frequency Performance Studies

High-frequency scattering (S)-parameter measurements were conducted in both the on and off states of the hBN switch using a vector network analyser (VNA). At the outset, as is standard practice, SOLT (short-open-load-through) or LRRM (line-reflect-reflect-match) on-wafer calibrations were performed to obtain precise results and to remove the extrinsic effects of the test cables and probe station as described in Cha, J., Cha, J. & Lee, S. Uncertainty analysis of two-step and three-step methods for deembedding on-wafer RF transistor measurements, IEEE Trans. Electron Devices 55, 2195-2201 (2008), incorporated by reference herein with respect to calibrations and test patterns. Subsequently, de-embedding processes using test patterns fabricated on the same substrate were conducted to obtain the intrinsic S parameters of hBN RF switches by eliminating the probe-pad and interconnect resistances, also as described in Cha, Cha, & Lee. The intrinsic experimental high-frequency characteristics of the monolayer hBN switch show ~0.27 dB insertion loss in the on state (FIG. 20, Part A) and isolation below 35 dB in the off state (FIG. 20, Part B) at frequencies up to 67 GHz.

The three performance parameters, $R_{on}$, $C_{off}$ and FCO, were determined using an equivalent lumped element circuit model. After the de-embedding process, $R_{on}$ and $C_{off}$ were extracted from the intrinsic S parameters in the on and off states, respectively, to obtain their quasi-static values. The extracted $R_{on}$ and $C_{off}$ are 2.8Ω and 0.44 fF, respectively. The FCO was calculated to be ~129 THz. These hBN switch results outperform the phase-change memory, memristive and microelectromechanical system RF switches with the added benefit of a heater-less ambient integration described in Ge et al. Another point of comparison is the switching ratio, $S_{21,off}$-$S_{21,on}$, with hBN clearly showing a higher ratio compared with those of other emerging RF switch devices. A noteworthy observation is the decreasing insertion loss of the hBN switch with frequency, a beneficial feature in contrast to conventional RF switches, in which the insertion loss increases with frequency due to parasitic inductive effects. The decreasing frequency dependency can be attributed to a parallel-plate on-state capacitance ($C_{on}$) in this nanoscale MIM structure, which is in parallel to the quasi-static $R_{on}$. In switches made from bulk materials, this capacitance is negligible (compared to the inductance) due to the large device size. Quite fortuitously, in this nanoscale realization, $C_{on}$ provides the desirable benefit of reducing the insertion loss. The insertion loss of the hBN switch can be further reduced by increasing the d.c. compliance current (FIG. 20, Part C) that can be explained in terms of an increased number in the conductive filaments or widening of the filaments in the MIM structure. The d.c. switching compliance current can achieve tunable resistance and insertion loss. The upswing is attributed to the unique on-state capacitance that arises from the atomically thin vertical structure, which results in a non-negligible $C_{on}$.

The corresponding $R_{on}$ dependence on the compliance current is shown in FIG. 20, Part D and follows a $R_{on}=r_o e^{-x/b}$ relation with the fitting parameters $r_o=72Ω$ and $b=19.7$ mA. The on-state resistance shows an exponentially decreasing dependency on the d.c. compliance current. Such variable (programmable) resistance states can be used in high-frequency device applications, such as non-volatile tunable resistors or attenuators.

Using a sophisticated probe station set-up, high-frequency measurements were extended to the terahertz range up to 220 GHz. The terahertz range refers to electromagnetic waves with frequencies between 100 GHz and 10 THz. The hBN device shows an insertion loss of less than 0.5 dB and isolation higher than 10 dB (FIG. 20, Part E). This result represents a realization of a non-volatile electronic switch working in the terahertz range. The ripples observed in the extended frequency range from 140 to 220 GHz are largely due to standing waves that arise from impedance mismatch, which does not impact the main findings and can be improved by optimized transmission line matching to the experimental set-up. The aforementioned measurements took several months and hence provided an opportunity to evaluate the retention of the hBN switches, which is shown in FIG. 2, Part F for a typical device and demonstrates good stability over 3 months at room temperature in air. It is expected that the retention is much longer, as may be shown using temperature-dependent accelerated testing.

Data Communication Studies Based on Eye Diagrams and BERs

To highlight the potential offered by hBN switches, several data communication tests were conducted for fc=100 GHz, with numerous applications of backhauling for 5G and beyond. One of the key aspects of future high-bandwidth networks is the latency time, and hence systems have to be validated using real-time BER testing, that is, without employing any power-hungry signal processing. In this context, amplitude modulation was chosen to demonstrate the capability of hBN switches to effectively route signals in the 100 GHz band. FIG. 21, Part A shows the experimental set-up used in this work, based on the photo-mixing of optical waves to efficiently generate high-speed modulated millimetre or terahertz wave signals, as further described in Nagatsuma, T., Ducournau, G. & Renaud, C. C. Advances in terahertz communications accelerated by photonics, Nat. Photon. 10, 371-379 (2016), incorporated by reference herein with respect to the described experimental setup. In the present experiments, data rates up to 8.5 Gbit s$^{-1}$ were used, according to the available bandwidth limit of the set-up (FIG. 21, Part B). This 8.5 Gbit s$^{-1}$ data-rate limit is not due to the hBN overall bandwidth, which is far higher, according to the measured S-parameter frequency response.

To demonstrate the operation of an hBN device according to the present disclosure in an application scenario, the BER was recorded as a function of the input power ($P_{in}$) (FIG. 21, Part E). First, a reference measurement was conducted using a direct connection (through) between the probes and the BER performance was determined by the 100 GHz emission and reception circuits. Then, three sets of measurements were acquired on the same hBN switch (FIG. 21, Part E): (1) first, the device was in the on state (blue curve), (2) then settled to the off state (red curve) and (3) lastly in the on state again (green curve). As can be seen, in the on state, the eye pattern is clear and the evolution of the BER values is the same as that using the reference (through), the power penalty being the small insertion loss of the hBN device over the frequency range of the modulated signal (100±8.5 GHz). For the off state, the isolation was 14 dB, and the eye pattern almost closed, with a very low BER performance. Note that, due to the set-up limitation (available power at 100 GHz and envelope detector sensitivity), 15 dB was the highest measurable isolation to ensure enough power level to drive the BER tester. Higher isolations were achieved with other hBN devices, for which the BER was not measurable. After the validation at 8.5 Gbit s$^{-1}$, lower data rates were tested (2 Gbit s$^{-1}$) and an almost perfect eye pattern was obtained, with BER values below 10-12 (FIG. 21, Parts C and D).

Beyond high-frequency characterization, validation of the hBN switch device for practical use was carried out in a realistic scenario. Specifically, a high-definition television data stream without any compression (1.5 Gbit s$^{-1}$) was successfully encoded in the 100 GHz carrier, transmitted through the hBN device in the on state, and decoded and displayed in real-time on a television. When the device was electrically switched in the off state, the data transmission was interrupted and the television stream vanished.

RF Power Handling and Self-Switching

Power handling refers to the maximum power a switch can transmit in the on state while it retains high isolation in the off state. FIG. 22 shows a typical on- and off-state power-handling measurement at 40 GHz in a monolayer hBN RF switch with a lateral area of 0.5×0.5 μm$^2$ for RF $P_{in}$ values from −20 to 30 dBm. In the on state, the output power increases linearly with $P_{in}$ with negligible compression up to 30 dBm (FIG. 22, Part A). The insertion losses derived from power measurements are in strong agreement (within 0.1 dB) with the insertion losses derived from S-parameter measurements.

In the off state, the output power presents high losses >20 dB, and a linear profile up to 19 dBm, and then the isolation is abruptly lost (FIG. 22, Part B). This is due to 'self-switching' of the device from the off to the on state, which is attributed to self-bias from the high-power RF signal.

Accounting for feedline losses, this corresponds to a root-mean-square average voltage less than 2 V, which is reasonable compared with the d.c. switching voltage.

Power-handling measurements at 18 GHz also confirmed the 40 GHz power data. Notably, the hBN RF switch offers 10 dB more power handling compared with that of a MoS$_2$ RF switch, and a factor-of-two higher power compared to memristive or VO$_2$ phase-change switches. Also, the switch does not return to the high-resistance state when the power is turned off, which means that the device is non-volatile and indicates that, besides d.c. switching, the hBN device can also be switched remotely by wireless signals of sufficient amplitude. Which was validated by remeasurement. As the hBN device was not damaged, it was switched from the on to the off state with a d.c. bias and then showed a similar self-switching when the RF power was applied again. Higher power handling requires a commensurately higher switching voltage, which is achievable by using few-layer hBN or using higher energy barrier metal electrodes.

Electrothermal Studies

We have shown that hBN switches with submicrometre dimensions can sustain a high power, about 20 and 30 dBm in the off and on states, respectively. At these power levels and given the small footprint of the switch, efficient heat dissipation becomes essential for reliable operation and to prevent device failure. In this regard, comprehensive electrothermal studies were conducted by combining infrared microscopy measurements and finite element simulations.

Infrared microscopy is a non-invasive technique that can be used to map the absolute surface temperature of a sample. As a fast and reliable calibration of an infrared camera requires the imaging of the sample at a well-known temperature, the substrate was kept at 45° C. during the whole experiment. The thermal mapping with spatial resolution ~2×2 μm$^2$ was achieved in situ during an actual high-power high-frequency switch operation.

FIG. 23, Parts A-D shows the thermal mapping of an hBN switch in the on state for $P_{in}$, which ranges from 19.7 to 29.3 dBm. At approximatively 20 dBm, the temperature of the area that surrounds the junction started to rise above the substrate temperature of 45° C. At this power, the high thermal conductivity of the diamond proved effective in limiting the temperature increase to only a few degrees. However, when the power was increased further, a hot spot centred at the junction area became clearly visible. For the maximum $P_{in}$ of 29.3 dBm, the temperature of the hot spot was substantially higher than that of the substrate, reaching 100° C. (FIG. 23, Part D). As the junction area was only 0.25

μm², well below the pixel size of our camera, the measured value corresponds to the average temperature centred around the hot spot. The actual junction temperature was undoubtedly higher.

To shed further insight, electrothermal simulation of the same mesa device structure was conducted using the multiphysics software package COMSOL and showed comparable (for 2×2 μm²) averaged temperatures to those of the thermal measurements (FIG. 23, Parts E and F). In addition, the simulation afforded a direct insight of the local hot-spot temperature at the junction, which was predicted to be approaching 250° C. at 30 dBm.

A reliable switch operation, especially at a high signal power, is essential, especially for transmitter applications. As such, the validated simulation platform can be used to explore or optimize device structures for thermal management to minimize the temperature rise during operating conditions. The design space for a device design optimization includes mesa versus trench versus fully embedded device structures, choice and dimensions of metal electrodes, dielectric coating, number of monolayers and so on.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A 2-dimensional (2D) non-volatile switch (2DNS) comprising:
a vertical metal-insulator-metal (MIM) structure comprising a top metal electrode, a bottom metal electrode, and a semiconducting monolayer crystalline non-metallic atomic sheet sandwiched between the top metal electrode and the bottom metal electrode;
wherein the monolayer crystalline non-metallic atomic sheet is operable to perform stable non-volatile resistance switching;
wherein the monolayer crystalline non-metallic atomic sheet comprises one or more defects including localized effects within 2D materials of the monolayer crystalline non-metallic atomic sheet and
wherein performance of the stable non-volatile resistance switching is based on a first resistance between one (1) and ten (10) ohms (Ω), a second resistance greater than one (1) kiloohm (kΩ), and the one or more defects.

2. The 2DNS of claim 1, wherein the monolayer crystalline non-metallic atomic sheet comprises a transition metal dichalcogenide (TMD).

3. The 2DNS of claim 2, wherein the TMD comprises a composition with a general formula $MX_2$,
wherein M is Molybdenum or Tungsten, and
wherein X is Sulphur, Selenium or Tellurium.

4. The 2DNS of claim 2, wherein the TMD comprises a single-crystal, chemical vapor deposition $MoS_2$.

5. The 2DNS of claim 2, wherein the TMD comprises $MoSe_2$.

6. The 2DNS of claim 2, wherein the TMD comprises $WS_2$.

7. The 2DNS of claim 2, wherein the TMD comprises $WSe_2$.

8. A 2DNS of claim 2, wherein the 2DNS is further operable to perform unipolar and bipolar switching.

9. The 2DNS of claim 1, wherein the monolayer crystalline non-metallic atomic sheet comprises hexagonal boron nitride (h-BN).

10. A 2DNS of claim 1, wherein at least one of the top metal electrode or the bottom metal electrode comprises Au.

11. A 2DNS of claim 1, wherein at least one of the top metal electrode or the bottom metal electrode comprises Ag.

12. A 2DNS of claim 1, wherein at least one of the top metal electrode or the bottom metal electrode comprises Ni.

13. A 2DNS of claim 1, wherein at least one of the top metal electrode or the bottom metal electrode comprises Cr.

14. The 2DNS of claim 13, an area of the 2DNS includes an area of fifteen (15) by fifteen (15) micrometers-squared (μm²).

15. The 2DNS of claim 13, wherein a barrier thickness of the monolayer crystalline non-metallic atomic sheet comprises a value of 0.7 nanometers or less.

16. A 2DNS of claim 1, wherein at least one of the top metal electrode or the bottom metal electrode comprises graphene.

17. The 2DNS of claim 1, wherein the one or more defects comprise one or more of line boundary defects and grain boundary defects.

18. The 2DNS of claim 1, wherein the monolayer crystalline non-metallic atomic sheet is operable to perform stable non-volatile resistance switching exhibiting a cut-off frequency between 120-130 THz, an insertion loss equal to or less than 0.5 dB, and an isolation greater than or equal to 10 dB within a bandwidth between 0.1 to 200 GHz based on selected vertical and lateral dimensions of the monolayer crystalline non-metallic atomic sheet.

19. The 2DNS of claim 1, wherein the monolayer crystalline non-metallic atomic sheet comprises an area, the first resistance, and the second resistance, wherein the first and second resistances are based on the area.

20. The 2DNS of claim 19, wherein the area comprises a first value and a second value, wherein the second resistance comprises a value inversely proportional with the first value of the area, and wherein, based on the second value exceeding a threshold area value, the second resistance comprises a value area-invariant based on the one or more defects.

* * * * *